(12) United States Patent
Kim

(10) Patent No.: US 11,183,579 B2
(45) Date of Patent: Nov. 23, 2021

(54) SEMICONDUCTOR DEVICE HAVING BURIED GATE STRUCTURE AND METHOD FOR FABRICATING THE SAME

(71) Applicant: SK hynix Inc., Gyeonggi-do (KR)

(72) Inventor: Dong-Soo Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/691,335

(22) Filed: Nov. 21, 2019

(65) Prior Publication Data

US 2020/0395461 A1 Dec. 17, 2020

(30) Foreign Application Priority Data

Jun. 17, 2019 (KR) ........................ 10-2019-0071564

(51) Int. Cl.
| | |
|---|---|
| *H01L 29/51* | (2006.01) |
| *H01L 29/423* | (2006.01) |
| *H01L 29/49* | (2006.01) |
| *H01L 21/28* | (2006.01) |
| *H01L 27/108* | (2006.01) |
| *H01L 21/3115* | (2006.01) |

(52) U.S. Cl.
CPC ...... *H01L 29/516* (2013.01); *H01L 21/28061* (2013.01); *H01L 21/28185* (2013.01); *H01L 21/28238* (2013.01); *H01L 21/3115* (2013.01); *H01L 27/10823* (2013.01); *H01L 27/10876* (2013.01); *H01L 29/4236* (2013.01); *H01L 29/4941* (2013.01)

(58) Field of Classification Search
CPC ......... H01L 21/28061; H01L 21/28105; H01L 21/28185; H01L 21/28238; H01L 21/3115; H01L 27/10823; H01L 27/10876; H01L 29/4236; H01L 29/4941; H01L 29/516
See application file for complete search history.

(56) References Cited

U.S. PATENT DOCUMENTS

| | | | |
|---|---|---|---|
| 8,901,630 B2 | 12/2014 | Huh et al. | |
| 9,673,276 B2* | 6/2017 | Kim ...................... | H01L 27/228 |
| 2017/0084615 A1 | 3/2017 | Lee et al. | |
| 2018/0308850 A1* | 10/2018 | Kang ................ | H01L 29/41783 |

* cited by examiner

*Primary Examiner* — Mohammed Shamsuzzaman
(74) *Attorney, Agent, or Firm* — IP & T Group LLP

(57) ABSTRACT

Disclosed is a semiconductor device for improving a gate induced drain leakage and a method for fabricating the same, and the method for fabricating semiconductor device may include forming a trench in a substrate; forming a gate dielectric layer over the trench, embedding a first dipole inducing portion in the gate dielectric layer on a lower side of the trench, filling a lower gate over the first dipole inducing portion, embedding a second dipole inducing portion in the gate dielectric layer on an upper side of the trench and forming an upper gate over the lower gate.

18 Claims, 15 Drawing Sheets

SEMICONDUCTOR DEVICE HAVING BURIED GATE STRUCTURE AND METHOD FOR FABRICATING THE SAME

CROSS-REFERENCE TO RELATED APPLICATIONS

The present application claims priority to Korean Patent Application No. 10-2019-0071564, filed on Jun. 17, 2019, which is incorporated herein by reference in its entirety.

BACKGROUND

1. Field

Various embodiments relate generally to a semiconductor device, and more particularly, to a semiconductor device having a buried gate structure and a method for fabricating the same.

2. Description of the Related Art

A metal gate electrode is applied for high performance of a transistor. Particularly, a buried gate type transistor requires control of a threshold voltage for a high-performance operation. In addition, gate induced drain leakage (GIDL) characteristics greatly affect the performance of the buried gate type transistor.

SUMMARY

The present invention relates generally to a semiconductor device, and more particularly, to a semiconductor device having a buried gate structure and a method for fabricating the same.

Various embodiments of the present invention are directed to a semiconductor device with a buried gate structure that may improve a gate induced drain leakage (GIDL). Various embodiments of the present invention are also directed to a method for fabricating the semiconductor device.

In accordance with an embodiment, a semiconductor device may include: a substrate; a first doped region and a second doped region formed to be spaced apart from each other by a trench in the substrate; a gate dielectric layer over the trench; a buried gate over the gate dielectric layer; a channel between the first doped region and the second doped region along a profile of the trench; a first dipole inducing portion embedded in the gate dielectric layer between the buried gate and the channel; and a second dipole inducing portion embedded in the gate dielectric layer between the buried gate and the first and second doped regions.

In accordance with an embodiment, a method for fabricating a semiconductor device may include: forming a trench in a substrate; forming a gate dielectric layer over the trench; embedding a first dipole inducing portion in the gate dielectric layer on a lower side of the trench; filling a lower gate over the first dipole inducing portion; embedding a second dipole inducing portion in the gate dielectric layer on an upper side of the trench; and forming an upper gate over the lower gate.

These and other features and advantages of the invention may be described in the following specific embodiments in conjunction with the appended figures.

DETAILED DESCRIPTION

Figure 1:
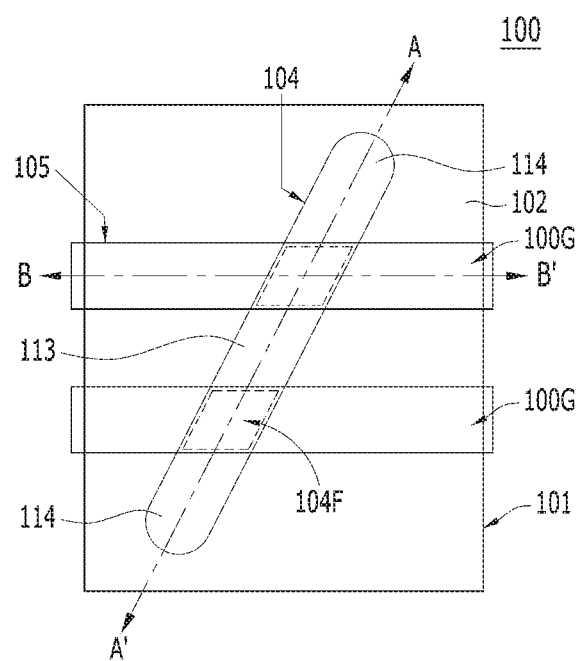
FIG. 1 is a plan view illustrating a semiconductor device in accordance with an embodiment of the present invention.

Various embodiments described herein may be described with reference to cross-sectional views, plan views and block diagrams, which are ideal schematic views of the semiconductor device according to specific embodiments of the present invention. It is noted that the structures of the drawings may be modified by fabricating techniques and/or tolerances. The present invention is not limited to the described embodiments and the specific structures shown in the drawings, but may include other embodiments, or modifications of the described embodiments including any changes in the structures that may be produced according to requirements of the fabricating process. Accordingly, the regions illustrated in the drawings have schematic attributes, and the shapes of the regions illustrated in the drawings are intended to illustrate specific structures of regions of the elements, and are not intended to limit the scope of the invention.

Hereinafter, in the present embodiments, a threshold voltage Vt may depend on a flat-band voltage VFB and the flat-band voltage VFB may depend on a work function. The work function may be adjusted by various methods. For example, the work function may be adjusted by the type of material employed for the gate electrode, or for the material employed between the gate electrode and the channel of a transistor. Adjusting the work function may cause the flat-band voltage to shift. Generally, A high work function may shift the flat-band voltage in a positive direction, and a low work function may shift the flat-band voltage in a negative direction. This way, the threshold voltage may be modulated by shifting the flat-band voltage. In various embodiments, the threshold voltage may be modulated by shifting the flat-band voltage even when the channel concentration is reduced or channel doping is omitted. In particular, the flat-band voltage may be lowered by employing a material having a low work function or dipole, thereby improving a gate induced drain leakage (GIDL).

Hereinafter, in various embodiments of the semiconductor device, a buried gate structure may be located in a trench. The buried gate structure may include a gate dielectric layer and a gate electrode. The gate dielectric layer may cover a surface of the trench, and the gate electrode may be formed on the gate dielectric layer. The gate electrode may partially fill the trench. The gate electrode may be referred to as a "buried gate electrode". The gate electrode may include a lower buried portion LB and an upper buried portion UB. The lower buried portion LB may fill a lower portion of the trench, and the upper buried portion UB may fill an upper portion of the trench on the lower buried portion LB. The upper buried portion UB may be formed on the lower buried portion LB. The gate electrode may be referred to as a dual gate electrode. The lower buried portion LB may overlap a channel formed between first and second doped regions, and the upper buried portion UB may partially overlap the first and second doped regions. The upper buried portion UB partially overlapping the first and second doped regions may mean that side walls of the upper buried portion UB may overlap side surface of the first and second doped regions. The first and second doped regions may be referred to as source and drain regions, respectively.

Figure 2A:
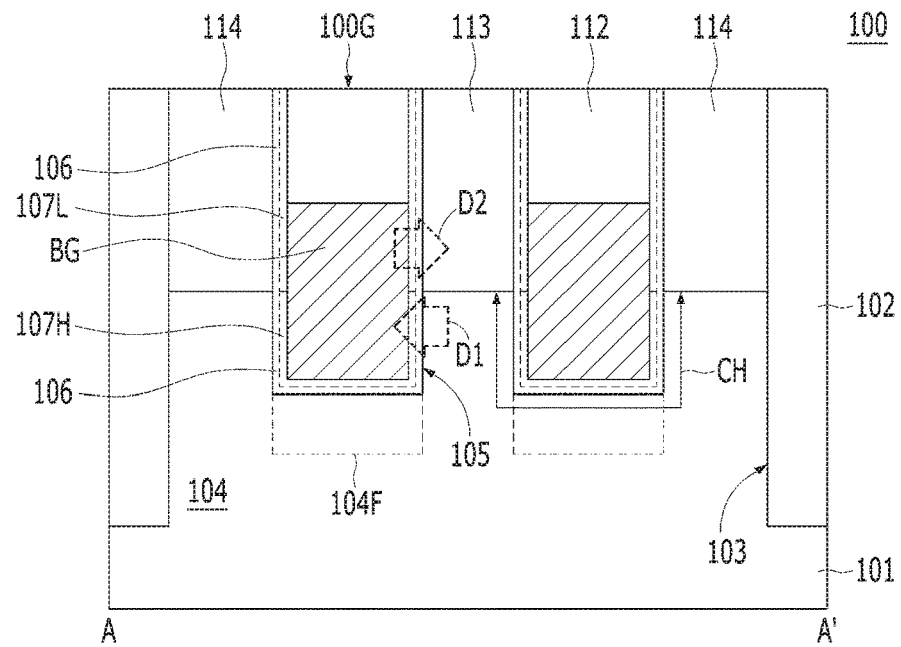
FIG. 2A is a cross-sectional view illustrating the semiconductor device taken along an A-A' line shown in FIG. 1.
Figure 2B:
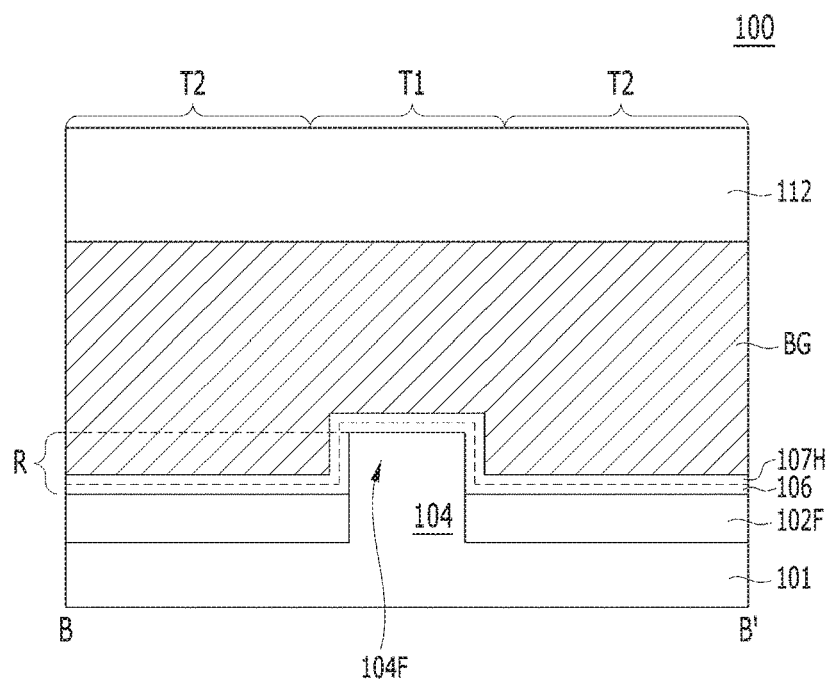
FIG. 2B is a cross-sectional view illustrating the semiconductor device taken along a B-B' line shown in FIG. 1.

FIG. 1 is a plan view illustrating a semiconductor device 100 in accordance with an embodiment of the present invention. FIG. 2A is a cross-sectional view illustrating the semiconductor device taken along an A-A' line shown in FIG. 1. FIG. 2B is a cross-sectional view illustrating the semiconductor device taken along a B-B' line shown in FIG. 1.

Referring to FIGS. 1 to 2B, the semiconductor device 100 may include a buried gate structure 100G, a first doped region 113 and a second doped region 114. An isolation layer 102 and an active region 104 may be formed in a substrate 101. The first and second doped regions 113 and 114 may be formed in the active region 104. A trench 105 may be formed across the active region 104 and the isolation layer 102. The buried gate structure 100G may be formed in the trench 105. A channel CH may be formed between the first doped region 113 and the second doped region 114 by the buried gate structure 100G. The channel CH may be defined along the profile of the trench 105. The semiconductor device 100 may be a part of a memory cell. For example, the semiconductor device 100 may be a cell transistor of a DRAM.

The semiconductor device 100 may include the substrate 101, the first and second doped regions 113 and 114 formed to be spaced apart from each other by the trench 105 in the substrate 101, a gate dielectric layer 106 covering the surface of the trench 105, a buried gate BG filling the trench 105 on the gate dielectric layer 106, the channel CH defined between the first doped region 113 and the second doped region 114 along the profile of the trench 105, a first dipole inducing portion 107H embedded in the gate dielectric layer 106 between the buried gate BG and the channel CH and a second dipole inducing portion 107L embedded in the gate dielectric layer 106 between the buried gate BG and the first and second doped regions 113 and 114. The first dipole inducing portion 107H and the second dipole inducing portion 107L may be disposed in the gate dielectric layer 106. The second dipole inducing portion 107L may also extend at a level higher than the buried gate BG and may have a top surface that is at the same level with a top surface of the gate dielectric layer 106 and respective top surfaces of the first and second doped regions 113, 114.

The semiconductor device 100 may be formed on the substrate 101. The substrate 101 may be a material suitable for semiconductor processing. The substrate 101 may include a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbon-doped silicon, combinations thereof or multi-layers thereof. The substrate 101 may include another semiconductor material, such as germanium. The substrate 101 may include an III/V-group semiconductor substrate, for example, a chemical compound semiconductor substrate such as gallium arsenide (GaAs). The substrate 101 may include a Silicon-On-Insulator (SOI) substrate.

The isolation layer 102 and the active region 104 may be formed in the substrate 101. The active regions 104 may be defined by the isolation layer 102. The isolation layer 102 may be a Shallow Trench Isolation (STI) region formed by trench etching. The isolation layer 102 may be formed by filling a shallow trench, for example, an isolation trench 103, with a dielectric material. The isolation layer 102 may include silicon oxide, silicon nitride or a combination thereof.

The trench 105 may be formed in the substrate 101. Referring to FIG. 1, the trench 105 may have a line shape extending in any one direction. The trench 105 may have a line shape crossing the active region 104 and the isolation layer 102. The trench 105 may have a shallower depth than the isolation trench 103. The trench 105 as shown in FIG. 2A has a flat bottom surface. However, in some embodiments (not shown), the bottom portion and bottom surface of the trench 105 may have a curvature. The trench 105 provides a space in which the buried gate structure 100G may be formed, and may be referred to as a "gate trench".

The first and second doped regions 113 and 114 may be formed in the active region 104. The first and second doped regions 113 and 114 are regions doped with conductive dopants. For example, the conductive dopants may include phosphorus (P), arsenic (As), antimony (Sb) or boron (B). The first and second doped regions 113 and 114 may be doped with the same conductive type of dopants. The first and second doped regions 113 and 114 may be located in the active region 104 on both sides of the trench 105. The bottom surfaces of the first and second doped regions 113 and 114 may be located at a predetermined depth from the top surface of the active region 104. The first and second doped regions 113 and 114 may contact the side walls of the trench 105. The bottom surfaces of the first and second doped regions 113 and 114 may be higher than the bottom surface of the trench 105. The first doped region 113 may be referred to as a "first source/drain region" and the second doped region 114 may be referred to as a "second source/drain region".

The trench 105 may include a first trench T1 and a second trench T2. The first trench T1 may be formed in the active region 104. The second trench T2 may be formed in the isolation layer 102. The trench 105 may have a shape that is continuously extended from the first trench T1 to the second trench T2. In the trench 105, the bottom surfaces of the first and second trenches T1 and T2 may be located at different levels. For example, the bottom surface of the first trench T1 may be located at a higher level than the bottom surface of the second trench T2. A difference in heights between the first trench T1 and the second trench T2 may be formed as the isolation layer 102 is recessed. Thus, the second trench T2 may include a recessed region R having a bottom surface that is lower than the bottom surface of the first trench T1. A fin region 104F may be formed in the active region 104 due to the step change in their depth between the first trench T1 and the second trench T2. Thus, the active region 104 may include the fin region 104F.

As described, the fin region 104F may be formed below the first trench T1, and the side walls of the fin region 104F are exposed by a recessed isolation layer 102F. The fin region 104F is a region in which a part of the channel CH may be formed. The fin region 104F is called a "saddle fin". The fin region 104F may increase the channel width and improve the electrical characteristics.

In an embodiment, the fin region 104F may be omitted.

The buried gate structure 100G may be embedded in the trench 105. For example, the buried gate structure 100G may be disposed in the trench 105. The buried gate structure 100G may be disposed in the active region 104 between the first doped region 113 and the second doped region 114, and extended into the isolation layer 102. In the buried gate structure 100G, the bottom surface of a portion disposed in the active region 104 and the bottom surface of a portion disposed in the isolation layer 102 may be located at different levels. In the case where the fin region 104F is omitted, in the buried gate structure 100G, the bottom surface of the portion disposed in the active region 104 and the bottom surface of the portion disposed in the isolation layer 102 may be located at the same level.

The buried gate structure 100G may include the gate dielectric layer 106, the first dipole inducing portion 107H, the second dipole inducing portion 107L, the buried gate BG and a capping layer 112.

The gate dielectric layer 106 may be conformally formed on the bottom surface and side walls of the trench 105. The gate dielectric layer 106 may include silicon oxide, silicon nitride, silicon oxynitride, a high-k material or combinations thereof. The high-k material may include a material having a higher dielectric constant than silicon oxide. For example, the high-k material may include any suitable material having a higher dielectric constant than 3.9. In an embodiment, the high-k material may include any suitable material having a higher dielectric constant than 10. In an embodiment, the high-k material may include any suitable material having a dielectric constant ranging from 10 to 30. The high-k material may include at least one metallic element. The high-k material may include a hafnium-containing material. The hafnium-containing material may include hafnium oxide, hafnium silicon oxide, hafnium silicon oxynitride or combinations thereof. In an embodiment, the high-k material may include lanthanum oxide, lanthanum aluminum oxide, zirconium oxide, zirconium silicon oxide, zirconium silicon oxynitride, aluminum oxide or combinations thereof. As the high-k material, other publicly-known high-k materials may also be selectively used. The gate dielectric layer 106 may include metal oxide. The gate dielectric layer 106 may have a shape surrounding the bottom surface and side walls of the buried gate BG.

The top surface of the buried gate BG may be located at a lower level than the top surfaces of the doped regions 113 and 114 of the active region 104. The buried gate BG may have a shape of filling the lower portion of the trench 105. The buried gate BG may be formed of a low-resistance material to decrease gate sheet resistance. The buried gate BG may be formed of a metal-based material. The buried gate BG may include, for example, a metal, metal nitride or a combination thereof. The buried gate BG may include tantalum nitride (TaN), titanium nitride (TIN), tungsten (W), tungsten nitride (WN) or combinations thereof. The buried gate BG may be formed of titanium nitride only. In addition, the buried gate BG may be formed of a stack of titanium nitride (TIN) and tungsten (W), i.e., TiN/W.

The capping layer 112 may serve to protect the buried gate BG. The capping layer 112 may fill the upper portion of the trench 105 on the buried gate BG. The capping layer 112 may be formed of a dielectric material including, for example, silicon nitride, silicon oxynitride or a combination thereof. In an embodiment, the capping layer 112 may include a combination of silicon nitride and silicon oxide. In an embodiment, the capping layer 112 may include a silicon nitride liner and a Spin-On-Dielectric (SOD) material.

The first and second dipole inducing portions 107H and 107L may be embedded in the gate dielectric layer 106. The first dipole inducing portion 107H may be embedded in the gate dielectric layer 106 on the lower side of the trench 105, and the second dipole inducing portion 107L may be embedded in the gate dielectric layer 106 on the upper side of the trench 105.

A method for embedding the first and second dipole inducing portions 107H and 107L in the gate dielectric layer 106 may be described below.

The first dipole inducing portion 107H may be located between the buried gate BG and the channel CH. The first dipole inducing portion 107H may be located in the gate dielectric layer 106 along the channel CH. The second dipole inducing portion 107L may be located between the buried gate BG and the first and second doped regions 113, 114. The second dipole inducing portion 107L may be located in the gate dielectric layer 106 and laterally overlapped with the first and second doped regions 113, 114. The first dipole inducing portion 107H may directly contact the lower portion of the buried gate BG. It is noted that the lower portion of the buried gate BG has a top surface that is at the same level as the top surface of the channel layer CH. The second dipole inducing portion 107L may directly contact the upper portion of the buried gate BG. The second dipole inducing portion 107L may also directly contact the capping layer 112. The first dipole inducing portion 107H may include a material that increases an effective work function of the lower portion of the buried gate BG. The second dipole inducing portion 107L may include a material that decreases an effective work function of the upper portion of the buried gate BG. The first dipole inducing portion 107H may include a material having a higher areal density of oxygen atoms than the gate dielectric layer 106. The second dipole inducing portion 107L may include a material having a lower areal density of oxygen atoms than the gate dielectric layer 106.

The first dipole inducing portion 107H may include a material having a higher areal density of oxygen atoms than silicon oxide ($SiO_2$). The areal density of oxygen atoms as this term is used herein is defined as the number of oxygen atoms per unit of volume. The first dipole inducing portion 107H and the gate dielectric layer 106 may have different areal densities of oxygen atoms. The first dipole inducing portion 107H may have a higher areal density of oxygen atoms than the gate dielectric layer 106. A high areal density of oxygen atoms may refer to a high oxygen content per unit volume. The ratio of the areal density of oxygen atoms of the first dipole inducing portion 107H to silicon oxide ($SiO_2$) may be greater than 1.

The first dipole inducing portion 107H may include a material having a higher oxygen content per unit volume than the gate dielectric layer 106. For example, when the gate dielectric layer 106 is silicon oxide ($SiO_2$), the first dipole inducing portion 107H may include a material having a higher areal density of oxygen atoms than silicon oxide, that is, a material having a high oxygen content per unit volume. The first dipole inducing portion 107H may contain a first chemical species including titanium, hafnium, tantalum, aluminum, zirconium or combinations thereof. The first chemical species may be referred to as a "first dipole inducing chemical species".

The gate dielectric layer 106 may be formed of silicon oxide, and the first dipole inducing portion 107H may be formed of silicon oxide containing the first chemical species. The silicon oxide containing the first chemical species may include silicon oxide doped, diffused or implanted with the first chemical species. For example, the first dipole inducing portion 107H may be titanium-diffused silicon oxide (Ti-diffused $SiO_2$), hafnium-diffused silicon oxide (Hf-diffused $SiO_2$), tantalum-diffused silicon oxide (Ta-diffused $SiO_2$), aluminum-diffused silicon oxide (Al-diffused $SiO_2$) or zirconium-diffused silicon oxide (Zr-diffused $SiO_2$), The first chemical species-diffused silicon oxide may be referred to as "metal silicate".

The second dipole inducing portion 107L may include a material having a lower areal density of oxygen atoms than silicon oxide ($SiO_2$). The second dipole inducing portion 107L and the gate dielectric layer 106 may have different areal densities of oxygen atoms. The second dipole inducing portion 107L may have a lower areal density of oxygen atoms than the gate dielectric layer 106. A low areal density of oxygen atoms may refer to a low oxygen content per unit volume. The ratio of the areal density of oxygen atoms of the second dipole inducing portion 107L to silicon oxide ($SiO_2$) may be smaller than 1.

The second dipole inducing portion 107L may include a material having a lower oxygen content per unit volume than the gate dielectric layer 106. For example, when the gate dielectric layer 106 is silicon oxide ($SiO_2$), the second dipole inducing portion 107L may include a material having a lower areal density of oxygen atoms than silicon oxide, that is, a material having a low oxygen content per unit volume. The second dipole inducing portion 107L may contain a second chemical species including lanthanum, barium, lutetium, strontium or combinations thereof. The second chemical species may be referred to as a "second dipole inducing chemical species".

The gate dielectric layer 106 may be formed of silicon oxide, and the second dipole inducing portion 107L may be formed of silicon oxide containing the second chemical species. The silicon oxide containing the second chemical species may include silicon oxide doped, diffused or implanted with the second chemical species. For example, the second dipole inducing portion 107L may be lanthanum-diffused silicon oxide (La-diffused $SiO_2$), barium-diffused silicon oxide (Ba-diffused $SiO_2$), lutetium-diffused silicon oxide (Lu-diffused $SiO_2$) or strontium-diffused silicon oxide (Sr-diffused $SiO_2$). The second chemical species-diffused silicon oxide may be referred to as "metal silicate".

Figure 3A:
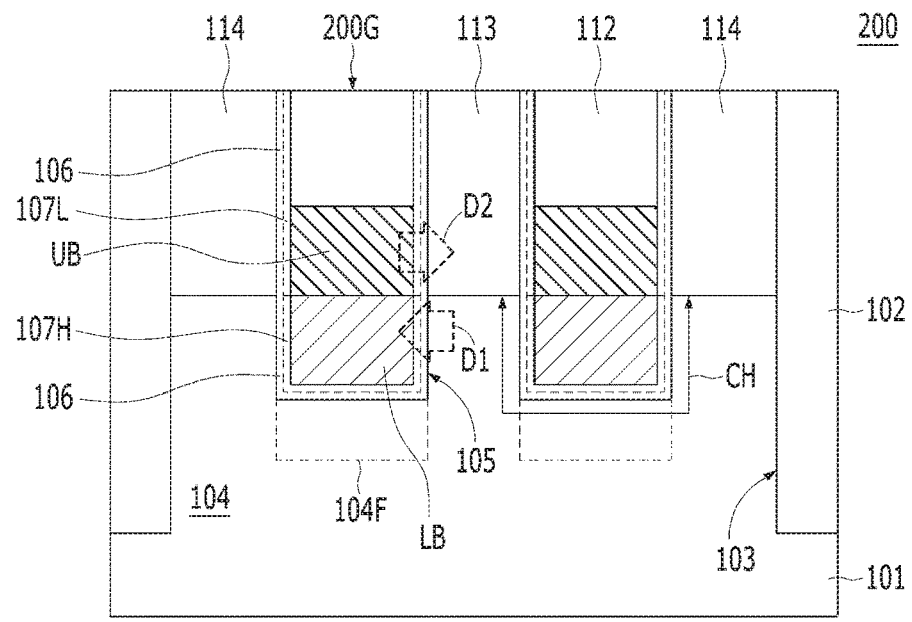
FIGS. 3A to 3C are cross-sectional views illustrating a semiconductor device in accordance with an embodiment of the present invention.

FIG. 3A is a cross-sectional view illustrating a semiconductor device 200 in accordance with an embodiment. The other configurations of the semiconductor device 200 illustrated in FIG. 3A may be similar to those of the semiconductor device 100 illustrated in FIG. 2A, except for a buried gate structure 200G. Hereinafter, in the present embodiment, detailed descriptions of configurations overlapping with those of the above-described embodiment may be omitted.

The semiconductor device 200 may include the buried gate structure 200G, a first doped region 113 and a second doped region 114. The buried gate structure 200G may include a gate dielectric layer 106, a first dipole inducing portion 107H, a second dipole inducing portion 107L, a lower buried portion LB, an upper buried portion UB and a capping layer 112. A stack of the lower buried portion LB and the upper buried portion UB may correspond to the buried gate BG of FIG. 2A.

The top surface of the lower buried portion LB may be located at a lower level than the top surface of the active region 104. The top surface of the lower buried portion LB may be located at a same level as the top surface of the channel CH. The top surface of the lower buried portion LB may be located at a same level as the bottom surfaces of the doped regions 113, 114. The lower buried portion LB may have a shape of filling the lower portion of a trench 105. The lower buried portion LB may be formed of a low-resistance material to decrease gate sheet resistance. The lower buried portion LB may be formed of a metal-based material. For example, the lower buried portion LB may include a metal, metal nitride or a combination thereof. For example, the lower buried portion LB may include tantalum nitride (TaN), titanium nitride (TiN), tungsten (W), tungsten nitride (WN) or combinations thereof. In an embodiment, the lower buried portion LB may be formed of titanium nitride only. In an embodiment, the lower buried portion LB may be formed of a stack of titanium nitride (TiN) and tungsten (W), i.e., TiN/W.

In an embodiment, the lower buried portion LB may have a high work function. The high work function refers to a work function higher than a mid-gap work function of silicon. A low work function refers to a work function lower than the mid-gap work function of silicon. Specifically, the high work function may be higher than 4.5 eV, and the low work function may be lower than 4.5 eV. For example, the lower buried portion LB may include P-type polysilicon.

In an embodiment, the lower buried portion LB may have an increased high work function. For example, the lower buried portion LB may include metal silicon nitride. The metal silicon nitride may be metal nitride doped with silicon. For example, the lower buried portion LB may include metal silicon nitride having an adjusted atomic percent of silicon. For example, the lower buried portion LB may be tantalum silicon nitride (TaSiN) or titanium silicon nitride (TiSiN). Titanium nitride may have a high work function, and contain silicon to further increase the work function thereof. Titanium silicon nitride may have an adjusted atomic percent of silicon, so as to have an increased high work function. In order to have the increased high work function, the atomic percent (at %) of silicon in the titanium silicon nitride may be equal to or less than 21 at %. As a comparative example, in order to have a low work function, the atomic percent (at %) of silicon in the titanium silicon nitride may be equal to or more than 30 at %.

The upper buried portion UB may be formed on the lower buried portion LB. The top surface of the upper buried portion UB may be located at a lower level than the top surface of the active region 104. The upper buried portion UB may have a shape of partially filling the upper portion of the trench 105. The upper and lower buried portions UB and LB may be made of the same material or different materials.

The upper buried portion UB may be formed of a low-resistance material to decrease gate sheet resistance. For example, the upper buried portion UB may be formed of a metal-based material. For example, the upper buried portion UB may include a metal, metal nitride or a combination thereof. In an embodiment, the upper buried portion UB may include tantalum nitride (TaN), titanium nitride (TiN), tungsten (W), tungsten nitride (WN) or combinations thereof. In an embodiment, the upper buried portion UB may be formed of titanium nitride only. In an embodiment, the upper buried portion UB may be formed of a stack of titanium nitride (TiN) and tungsten (W), i.e., TiN/W. In an embodiment, each of the lower and upper buried portions LB and UB may be formed of titanium nitride only. In an embodiment, each of the lower and upper buried portions LB and UB may be formed of a stack of titanium nitride (TiN) and tungsten (W), i.e., TIN/W. The upper buried portion UB may have a smaller height than the lower buried portion LB, and thus the volume of the lower buried portion LB occupied in the trench 105 may be larger. The lower and upper buried portions LB and UB may have the same height or different heights.

In an embodiment, the upper buried portion UB may have a low work function. In an embodiment, the upper buried portion UB may include N-type polysilicon. In an embodiment, the lower buried portion LB may be P-type polysilicon, and the upper buried portion UB may be N-type polysilicon. Further, in an embodiment, the lower buried portion LB may be formed of a stack of titanium nitride and tungsten (TIN/W), and the upper buried portion UB may be N-type polysilicon.

In an embodiment, the lower buried portion LB may be formed of a low-resistance metal-based material, and the upper buried portion UB may be formed of a material having a low work function.

In an embodiment, the lower buried portion LB may be formed of a low-resistance material, and the upper buried portion UB may be formed of a material having a low work function.

In an embodiment, the lower buried portion LB may be formed of a low-resistance material having a high work function, and the upper buried portion UB may be formed of a low-resistance material having a low work function.

In an embodiment, the lower and upper buried portions LB and UB may be formed of the same low-resistance metal-based material. Specifically, the lower buried portion LB may include a low-resistance metal-based material having a high work function, and the upper buried portion UB may include a low-resistance metal-based material having a low work function. In an embodiment, each of the lower and upper buried portions LB and UB may be formed of titanium nitride. Specifically, the lower buried portion LB may include titanium nitride having a high work function, and the upper buried portion UB may include titanium nitride having a low work function.

The first and second dipole inducing portions 107H and 107L may be embedded in the gate dielectric layer 106. A method for embedding the first and second dipole inducing portions 107H and 107L in the gate dielectric layer 106 may be described below.

The first dipole inducing portion 107H may be located between the lower buried portion LB and a channel CH. The second dipole inducing portion 107L may be located between the upper buried portion UB and the first and second doped regions 113 and 114. The first dipole inducing portion 107H may directly contact the lower buried portion LB, and the second dipole inducing portion 107L may directly contact the upper buried portion UB. The second dipole inducing portion 107L may also directly contact the capping layer 112. The first dipole inducing portion 107H may include a material that increases a valid work function of the lower buried portion LB. The second dipole inducing portion 107L may include a material that decreases a valid work function of the upper buried portion UB. The first dipole inducing portion 107H may include a material having a higher areal density of oxygen atoms than the gate dielectric layer 106. The second dipole inducing portion 107L may include a material having a lower areal density of oxygen atoms than the gate dielectric layer 106.

The first dipole inducing portion 107H may include a material having a higher areal density of oxygen atoms than silicon oxide ($SiO_2$). The first dipole inducing portion 107H and the gate dielectric layer 106 may have different areal densities of oxygen atoms. The first dipole inducing portion 107H may have a higher areal density of oxygen atoms than the gate dielectric layer 106. A high areal density of oxygen atoms may refer to a high oxygen content per unit volume. The ratio of the areal density of oxygen atoms of the first dipole inducing portion 107H to silicon oxide ($SiO_2$) may be greater than 1.

The first dipole inducing portion 107H may include a material having a higher oxygen content per unit volume than the gate dielectric layer 106. For example, when the gate dielectric layer 106 is silicon oxide ($SiO_2$), the first dipole inducing portion 107H may include a material having a higher areal density of oxygen atoms than silicon oxide, that is, a material having a high oxygen content per unit volume. The first dipole inducing portion 107H may contain a first chemical species, and the first chemical species may include titanium, hafnium, tantalum, aluminum, zirconium or combinations thereof.

The gate dielectric layer 106 may be formed of silicon oxide, and the first dipole inducing portion 107H may be formed of silicon oxide containing the first chemical species. The silicon oxide containing the first chemical species may include silicon oxide doped, diffused or implanted with the first chemical species. For example, the first dipole inducing portion 107H may be titanium-diffused silicon oxide (Ti-diffused $SiO_2$), hafnium-diffused silicon oxide (Hf-diffused $SiO_2$), tantalum-diffused silicon oxide (Ta-diffused $SiO_2$), aluminum-diffused silicon oxide (Al-diffused $SiO_2$) or zirconium-diffused silicon oxide (Zr-diffused $SiO_2$). The first chemical species-diffused silicon oxide may be referred to as "metal silicate".

The second dipole inducing portion 107L may include a material having a lower areal density of oxygen atoms than silicon oxide ($SiO_2$). The second dipole inducing portion 107L and the gate dielectric layer 106 may have different areal densities of oxygen atoms. The second dipole inducing portion 107L may have a lower areal density of oxygen atoms than the gate dielectric layer 106. A low areal density of oxygen atoms may refer to a low oxygen content per unit volume. The ratio of the areal density of oxygen atoms of the second dipole inducing portion 107L to silicon oxide (S102) may be smaller than 1.

The second dipole inducing portion 107L may include a material having a lower oxygen content per unit volume than the gate dielectric layer 106. For example, when the gate dielectric layer 106 is silicon oxide ($SiO_2$), the second dipole inducing portion 107L may include a material having a lower areal density of oxygen atoms than silicon oxide, that is, a material having a low oxygen content per unit volume. The second dipole inducing portion 107L may contain a second chemical species, and the second chemical species may include lanthanum, barium, lutetium, strontium or combinations thereof.

The gate dielectric layer 106 may be formed of silicon oxide, and the second dipole inducing portion 107L may be formed of silicon oxide containing the second chemical species. The silicon oxide containing the second chemical species may include silicon oxide doped, diffused or implanted with the second chemical species. For example, the second dipole inducing portion 107L may be lanthanum-diffused silicon oxide (La-diffused $SiO_2$), barium-diffused silicon oxide (Ba-diffused $SiO_2$), lutetium-diffused silicon oxide (Lu-diffused $SiO_2$) or strontium-diffused silicon oxide (Sr-diffused $SiO_2$). The second chemical species-diffused silicon oxide may be referred to as "metal silicate".

Figure 3B:
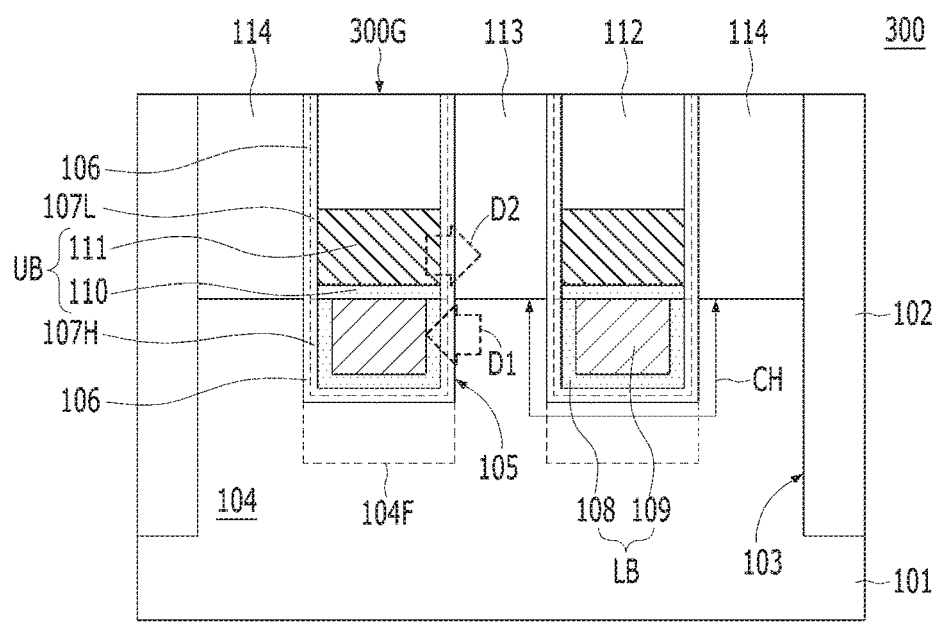

FIG. 3B is a cross-sectional view illustrating a semiconductor device 300 in accordance with an embodiment. The other configurations of the semiconductor device 300 illustrated in FIG. 3B may be similar to those of the semiconductor device 100 illustrated in FIG. 2A, except for a buried gate structure 300G. Hereinafter, in the present embodiment, detailed descriptions of configurations overlapping with those of the above-described embodiment may be omitted.

Referring to FIG. 3B, the semiconductor device 300 may include the buried gate structure 300G, a first doped region 113 and a second doped region 114.

The buried gate structure 300G may include a gate dielectric layer 106, a first dipole inducing portion 107H, a second dipole inducing portion 107L, a lower buried portion LB, an upper buried portion UB and a capping layer 112. A stack of the lower buried portion LB and the upper buried portion UB may correspond to the buried gate BG of FIG. 2A.

For example, the lower buried portion LB may include a first barrier layer 108 and a first gate electrode 109, and the upper buried portion UB may include a second barrier layer 110 and a second gate electrode 111.

The first barrier layer 108 may be conformally formed on the gate dielectric layer 106. The first gate electrode 109 may be formed on the first barrier layer 108. The top surfaces of the first barrier layer 108 and the first gate electrode 109 may be located at a lower level than the top surface of an active region 104. The top surfaces of the first barrier layer 108 and the first gate electrode 109 may be located at the same level as the top surface of the channel CH. The top surfaces of the first barrier layer 108 and the first gate electrode 109 may be located at a same level as the bottom surfaces of the doped regions 113, 114. The first barrier layer 108 and the first gate electrode 109 may have a shape of filling the lower portion of a trench 105. The first barrier layer 108 and the first gate electrode 109 may be low-resistance materials to decrease gate sheet resistance. The first barrier layer 108 and the first gate electrode 109 may be metal-based materials.

The first barrier layer 108 may include metal nitride. The first barrier layer 108 may be formed of tantalum nitride (TaN) or titanium nitride (TiN). In an embodiment, the first barrier layer 108 may have a high work function. The high work function refers to a work function higher than a mid-gap work function of silicon. A low work function refers to a work function lower than the mid-gap work function of silicon. Specifically, the high work function may be higher than 4.5 eV, and the low work function may be lower than 4.5 eV.

The first barrier layer 108 may have an increased high work function. The first barrier layer 108 may include metal silicon nitride. The metal silicon nitride may be metal nitride doped with silicon. The first barrier layer 108 may be metal silicon nitride having an adjusted atomic percent of silicon. For example, the first barrier layer 108 may be tantalum silicon nitride (TaSiN) or titanium silicon nitride (TiSiN). Titanium nitride may have a high work function, and contain silicon to further increase the work function thereof. Titanium silicon nitride may have an adjusted atomic percent of silicon, so as to have an increased high work function. In order to have the increased high work function, the atomic percent (at %) of silicon in the titanium silicon nitride may be equal to or less than 21 at %. As a comparative example, in order to have a low work function, the atomic percent (at %) of silicon in the titanium silicon nitride may be equal to or more than 30 at %. The first barrier layer 108 and the first dipole inducing portion 107H may directly contact each other.

The first gate electrode 109 may include a metal or metal nitride. The first gate electrode 109 may include tungsten or titanium nitride. When tungsten is used as the first gate electrode 109, the gate dielectric layer 106 may be attacked. For example, a tungsten layer may be deposited using tungsten hexafluoride ($WF_6$) gas, and at this time, the gate dielectric layer 106 may be attacked by fluorine. Accordingly, the first barrier layer 108 may be formed between the first gate electrode 109 and the gate dielectric layer 106 to prevent fluorine from attacking the gate dielectric layer 106. In the present embodiment, the first gate electrode 109 may be formed of tungsten (W), and the first barrier layer 108 may be formed of titanium nitride (TiN). For example, the lower buried portion LB may include a stack of TiN/W.

The second barrier layer 110 may be formed on the first gate electrode 109 and the top surface of the first barrier layer 108. The second barrier layer 110 may be formed between the top surface of the lower buried portion LB and the second gate electrode 111. The top surface of the lower buried portion LB may include the top surface of the first gate electrode and the top surface of the first barrier layer 108. The second barrier layer 110 may be formed between the first gate electrode 109 and the second gate electrode 111. The second barrier layer 110 may be formed between the first barrier layer 108 and the second gate electrode 111. The first and second barrier layers 108 and 110 may be made of the same material or different materials. The second barrier layer 110 may include metal nitride. The second barrier layer 110 may be formed of tantalum nitride (TaN), titanium nitride (TiN) or tungsten nitride (WN). As may be described below, the second barrier layer 110 may be formed by a deposition process such as physical vapor deposition (PVD) or by a plasma treatment such as plasma nitridation.

The second gate electrode 111 may be formed on the second barrier layer 110. The top surface of the second gate electrode 111 may be located at a lower level than the top surface of the active region 104. The second barrier layer 110 and the second gate electrode 111 may have a shape of partially filling the upper portion of the trench 105. The second gate electrode 111 may include a material having a low work function. The second gate electrode 111 may include polysilicon having a low work function, for example, polysilicon doped with an N-type impurity. The second gate electrode 111 and the second dipole inducing portion 107L may directly contact each other.

The capping layer 112 may serve to protect the second gate electrode 111. The capping layer 112 may fill the upper portion of the trench 105 on the second gate electrode 111. The capping layer 112 may include a dielectric material. The capping layer 112 may include silicon nitride, silicon oxynitride or a combination thereof. In an embodiment, the capping layer 112 may include a combination of silicon nitride and silicon oxide. The capping layer 112 may include a silicon nitride liner and a Spin-On-Dielectric (SOD) material.

Figure 3C:
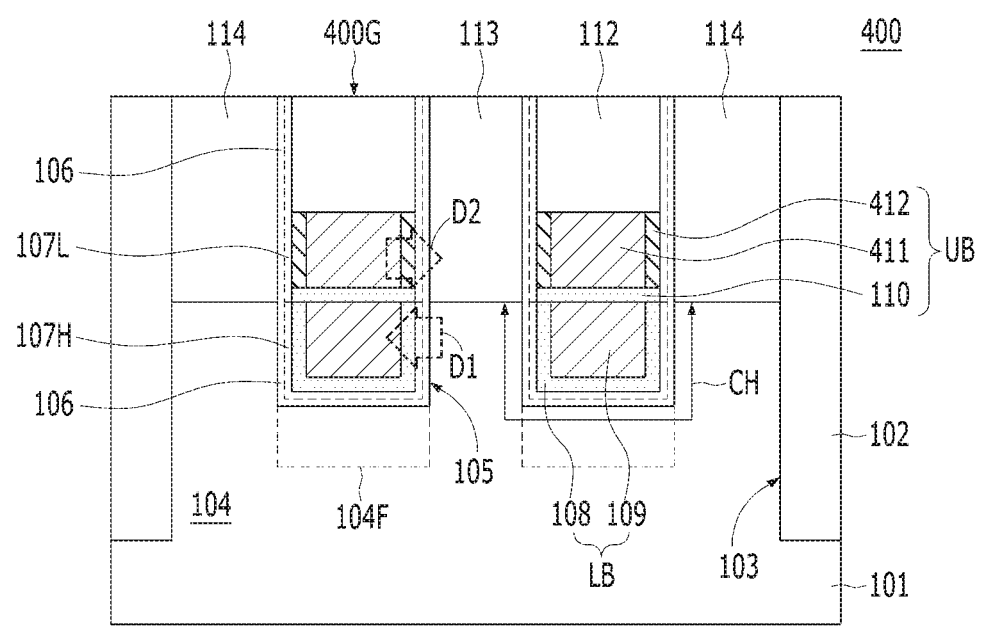

FIG. 3C is a cross-sectional view illustrating a semiconductor device 400 in accordance with an embodiment. The other configurations of the semiconductor device 400 illustrated in FIG. 3C may be similar to those of the semiconductor device 100 illustrated in FIG. 2A, except for a buried gate structure 400G. Hereinafter, in the present embodiment, detailed descriptions of configurations overlapping with those of the above-described embodiment may be omitted.

Referring to FIG. 3C, the semiconductor device 400 may include the buried gate structure 400G, a first doped region 113 and a second doped region 114.

The buried gate structure 400G may include a gate dielectric layer 106, a first dipole inducing portion 107H, a second dipole inducing portion 107L, a lower buried portion LB, an upper buried portion UB and a capping layer 112. A stack of the lower buried portion LB and the upper buried portion UB may correspond to the buried gate BG of FIG. 2A.

For example, the lower buried portion LB may include a first barrier layer 108 and a first gate electrode 109, and the upper buried portion UB may include a second barrier layer 110, a second gate electrode 411 and a low work function gate electrode 412.

The first barrier layer 108 may be conformally formed on the gate dielectric layer 106. The first gate electrode 109 may be formed on the first barrier layer 108. The top surfaces of the first barrier layer 108 and the first gate electrode 109 may be located at a lower level than the top surface of an active region 104. The top surfaces of the first barrier layer 108 and the first gate electrode 109 may be located at a same level as the bottom surface of the doped regions 113, 114. The top surfaces of the first barrier layer 108 and the first gate electrode 109 may be located at the same level as the top surface of the channel CH. The first barrier layer 108 and the first gate electrode 109 may have a shape of filling the lower portion of a trench 105. The first barrier layer 108 and the first gate electrode 109 may be low-resistance materials to decrease gate sheet resistance. The first barrier layer 108 and the first gate electrode 109 may be metal-based materials.

The first barrier layer 108 may include metal nitride. The first barrier layer 108 may be formed of tantalum nitride (TaN) or titanium nitride (TiN). In an embodiment, the first barrier layer 108 may have a high work function. The high work function refers to a work function higher than a mid-gap work function of silicon. A low work function refers to a work function lower than the mid-gap work function of silicon. Specifically, the high work function may be higher than 4.5 eV, and the low work function may be lower than 4.5 eV.

The first barrier layer 108 may have an increased high work function. The first barrier layer 108 may include metal silicon nitride. The metal silicon nitride may be metal nitride doped with silicon. The first barrier layer 108 may be metal silicon nitride having an adjusted atomic percent of silicon. For example, the first barrier layer 108 may be tantalum silicon nitride (TaSiN) or titanium silicon nitride (TiSiN). Titanium nitride may have a high work function, and contain silicon to further increase the work function thereof. Titanium silicon nitride may have an adjusted atomic percent of silicon, so as to have an increased high work function. In order to have the increased high work function, the atomic percent (at %) of silicon in the titanium silicon nitride may be equal to or less than 21 at %. As a comparative example, in order to have a low work function, the atomic percent (at %) of silicon in the titanium silicon nitride may be equal to or more than 30 at %. The first barrier layer 108 and the first dipole inducing portion 107H may directly contact each other.

The first gate electrode 109 may include a metal or metal nitride. The first gate electrode 109 may include tungsten or titanium nitride. When tungsten is used as the first gate electrode 109, the gate dielectric layer 106 may be attacked. For example, a tungsten layer may be deposited using tungsten hexafluoride ($WF_6$) gas, and at this time, the gate dielectric layer 106 may be attacked by fluorine. Accordingly, the first barrier layer 108 may be formed between the first gate electrode 109 and the gate dielectric layer 106 to prevent fluorine from attacking the gate dielectric layer 106. In the present embodiment, the first gate electrode 109 may be formed of tungsten (W), and the first barrier layer 108 may be formed of titanium nitride (TiN). Accordingly, for example, the lower buried portion LB may include a stack of TiN/W.

The second barrier layer 110 may be formed on the first gate electrode 109. The second barrier layer 110 may be formed between the first gate electrode 109 and the second gate electrode 411. The first and second barrier layers 108 and 110 may be made of the same material or different materials. The second barrier layer 110 may include metal nitride. The second barrier layer 110 may be formed of tantalum nitride (TaN), titanium nitride (TiN) or tungsten nitride (WN). As may be described below, the second barrier layer 110 may be formed by a deposition process such as physical vapor deposition or by a plasma treatment such as plasma nitridation.

The second gate electrode 411 and the low work function gate electrode 412 may be formed on the second barrier layer 110. The top surfaces of the second gate electrode 411 and the low work function gate electrode 412 may be located at a lower level than the top surface of the active region 104. The second barrier layer 110, the second gate electrode 411 and the low work function gate electrode 412 may have a shape of partially filling the upper portion of the trench 105. The second gate electrode 411 may include a metal-based material. The low work function gate electrode 412 may include polysilicon having a low work function, for example, polysilicon doped with an N-type impurity. The low work function gate electrode 412 and the second dipole inducing portion 107L may directly contact each other.

The capping layer 112 may serve to protect the second gate electrode 411 and the low work function gate electrode 412. The capping layer 112 may fill the upper portion of the trench 105 on the second gate electrode 411 and the low work function gate electrode 412. The capping layer 112 may include a dielectric material. The capping layer 112 may include silicon nitride, silicon oxynitride or a combination thereof. In an embodiment, the capping layer 112 may include a combination of silicon nitride and silicon oxide. The capping layer 112 may include a silicon nitride liner and a Spin-On-Dielectric (SOD) material.

As illustrated in FIGS. 1 to 2B, the first dipole inducing portion 107H may be embedded in the gate dielectric layer 106 between the lower portion of the buried gate BG and the channel CH. The second dipole inducing portion 107L may be embedded in the gate dielectric layer 106 between the upper portion of the buried gate BG and the first and second doped regions 113 and 114.

As illustrated in FIGS. 3A to 3C, the first dipole inducing portion 107H may be embedded in the gate dielectric layer 106 between the lower buried portion LB and the channel CH. The second dipole inducing portion 107L may be embedded in the gate dielectric layer 106 between the upper buried portion UB and the first and second doped regions 113 and 114.

The first dipole inducing portion 107H may induce a high work function, and the second dipole inducing portion 107L may induce a low work function. A first dipole D1 may be generated at the interface between the first dipole inducing portion 107H and the gate dielectric layer 106. A second dipole D2 may be generated at the interface between the second dipole inducing portion 107L and the gate dielectric layer 106. The first dipole D1 may be generated due to a difference in the areal density of oxygen atoms between the first dipole inducing portion 107H and the gate dielectric layer 106. The second dipole D2 may be generated due to a difference in the areal density of oxygen atoms between the second dipole inducing portion 107L and the gate dielectric layer 106.

The areal density of oxygen atoms in the first dipole inducing portion 107H is higher than that of the gate dielectric layer 106. Oxygen atoms of the first dipole inducing portion 107H may be diffused into the gate dielectric layer 106 due to the difference between the areal densities of oxygen atoms. Through the diffusion of oxygen atoms, the first dipole inducing portion 107H becomes positively charged, and the gate dielectric layer 106 becomes negatively charged. As such, the first dipole D1 is induced at the interface between the negatively-charged gate dielectric layer 106 and the positively-charged first dipole inducing portion 107H. When the first dipole D1 is induced, energy bands of the lower portion of the buried gate BG and the lower buried portion LB are decreased, and thus the lower portion of the buried gate BG and the lower buried portion LB may have increased work functions. As a result, a threshold voltage may be easily modulated as the work functions of the lower portion of the buried gate BG and the lower buried portion LB increase.

An areal density of oxygen atoms in the second dipole inducing portion 107L may be lower than that of the gate dielectric layer 106. Oxygen atoms of the gate dielectric layer 106 may be diffused into the second dipole inducing portion 107L due to the difference between the areal densities of oxygen atoms. Through the diffusion of oxygen atoms, the gate dielectric layer 106 becomes positively charged, and the second dipole inducing portion 107L becomes negatively charged. As such, the second dipole D2 is induced at the interface between the positively-charged gate dielectric layer 106 and the negatively-charged second dipole inducing portion 107L. When the second dipole D2 is induced, energy bands of the upper portion of the buried gate BG and the upper buried portion UB are increased, and thus the upper portion of the buried gate BG and the upper buried portion UB may have decreased work functions. As a result, a GIDL may be suppressed as the work functions of the upper portion of the buried gate BG and the upper buried portion UB decrease.

As described above, the work function may be controlled by controlling the polarity direction of the dipole. A high work function may be induced by the first dipole D1, and a low work function may be induced by the second dipole D2. The threshold voltage Vt may be modulated by the first dipole inducing portion 107H. For example, the threshold voltage Vt may be shifted by the first dipole inducing portion 107H. The first dipole D1 may induce the high work function, thereby shifting the threshold voltage Vt. As a result, a channel dose of the channel CH may be lowered by the first dipole inducing portion 107H. For example, when the first dipole inducing portion 107H is a material having a larger oxygen content ratio per unit volume than the gate dielectric layer 106, the first dipole D1 in the direction of inducing a high work function may be generated. When the second dipole inducing portion 107L is a material having a smaller oxygen content ratio per unit volume than the gate dielectric layer 106, the second dipole D2 in the direction of inducing a low work function may be generated.

Since the trench 105 has a high aspect ratio, it is difficult to sufficiently perform doping to the bottom of the trench 105 or the fin region 104F by general channel doping. Thus, after the channel doping, channel doping may be further performed locally on the bottom of the trench 105 or the fin region 104F, which is referred to as "local channel doping". When implantation is applied as the local channel doping, it is referred to as "Local Channel Implantation (LCI)".

Since the threshold voltage Vt may be modulated by the first dipole inducing portion 107H, the dose of the LCI may be remarkably lowered or the LCI may be omitted. As a result, these embodiments lower the channel dose, thereby improving junction leakage characteristics.

Further, the second dipole inducing portion 107L may suppress the GIDL. As illustrated in FIGS. 3A and 3B, the GIDL may be further suppressed by the upper buried portion UB having a low work function.

It has been found that when the first dipole inducing portion 107H overlaps with the first and second doped regions 113 and 114, the GIDL may be increased due to the high work function induction. Accordingly, the height of the first dipole inducing portion 107H may be adjusted to not-overlap with the first and second doped regions 113 and 114. In other words, the height of the first dipole inducing portion 107H may be adjusted to not extend at the same level with the with the first and second doped regions 113 and 114.

Figure 4A:
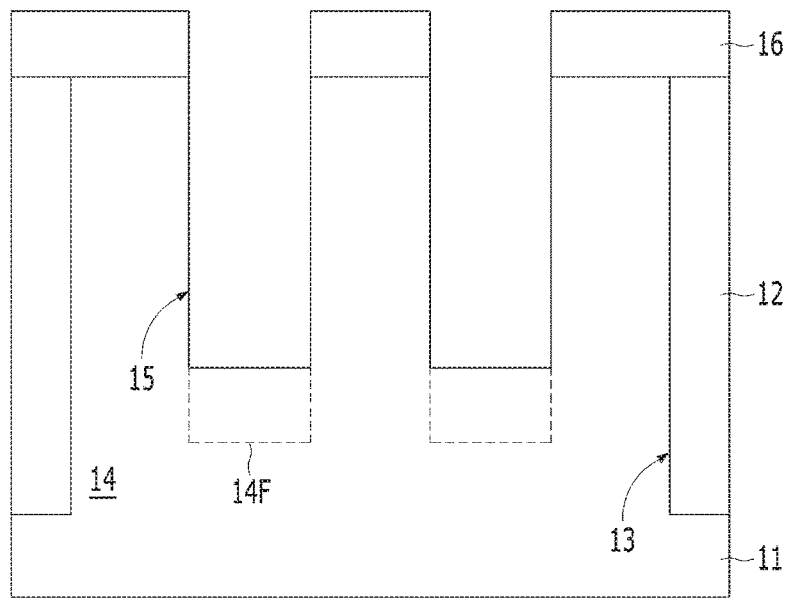
FIGS. 4A to 4O are cross-sectional views illustrating an example of a method for forming a semiconductor device in accordance with an embodiment.
Figure 4B:
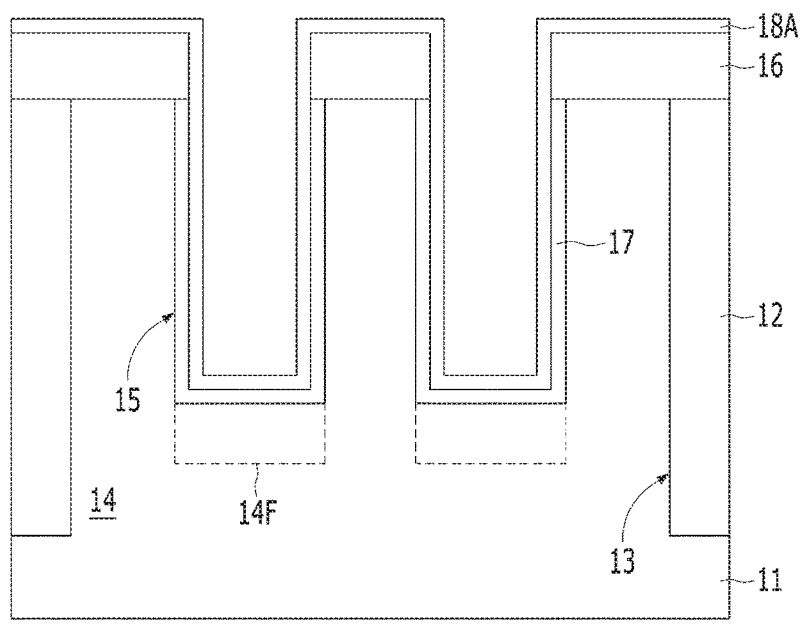
Figure 4C:
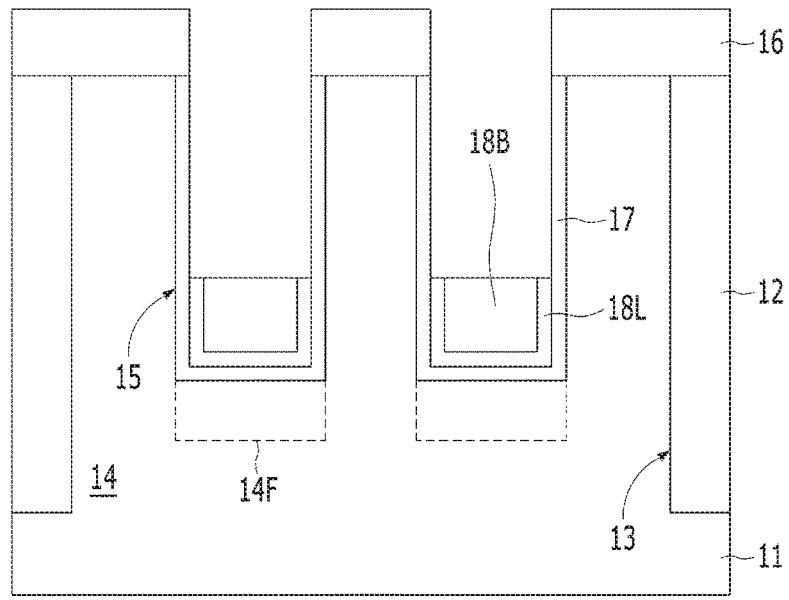
Figure 4D:
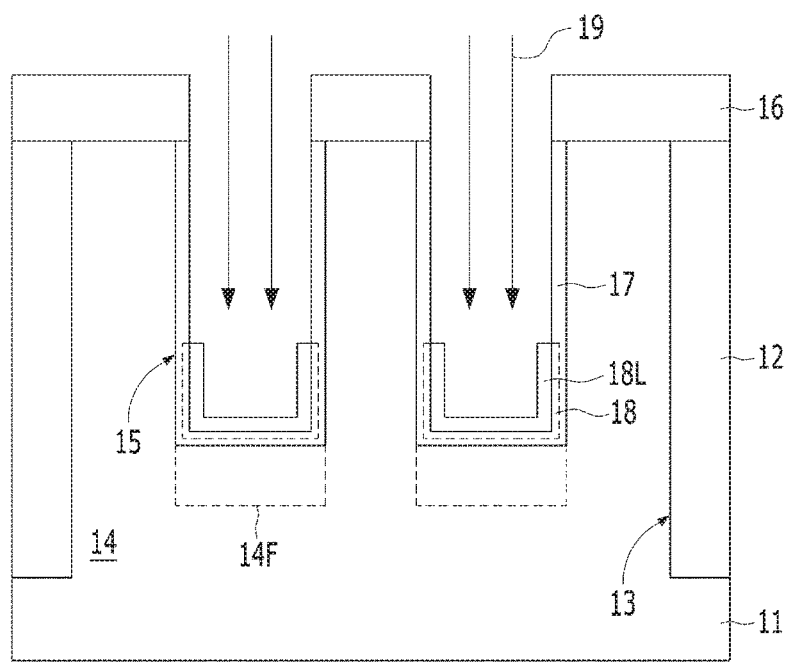
Figure 4E:
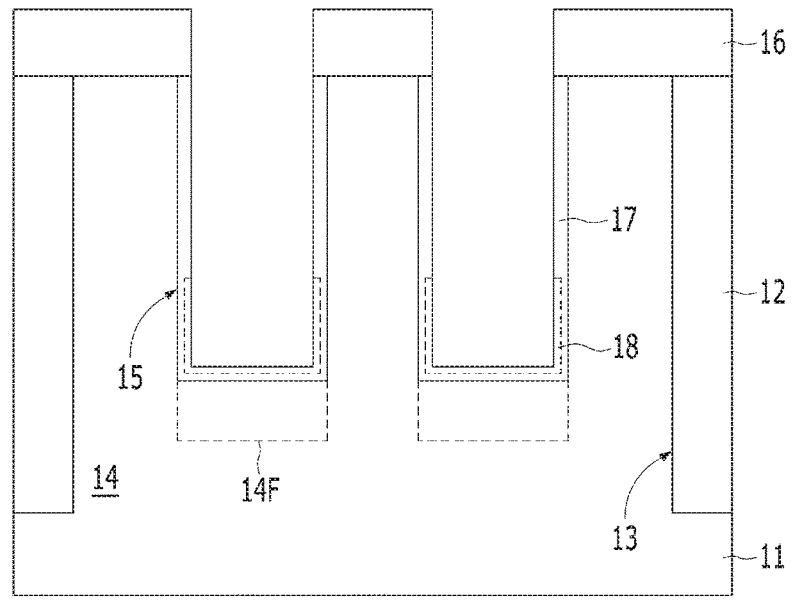
Figure 4F:
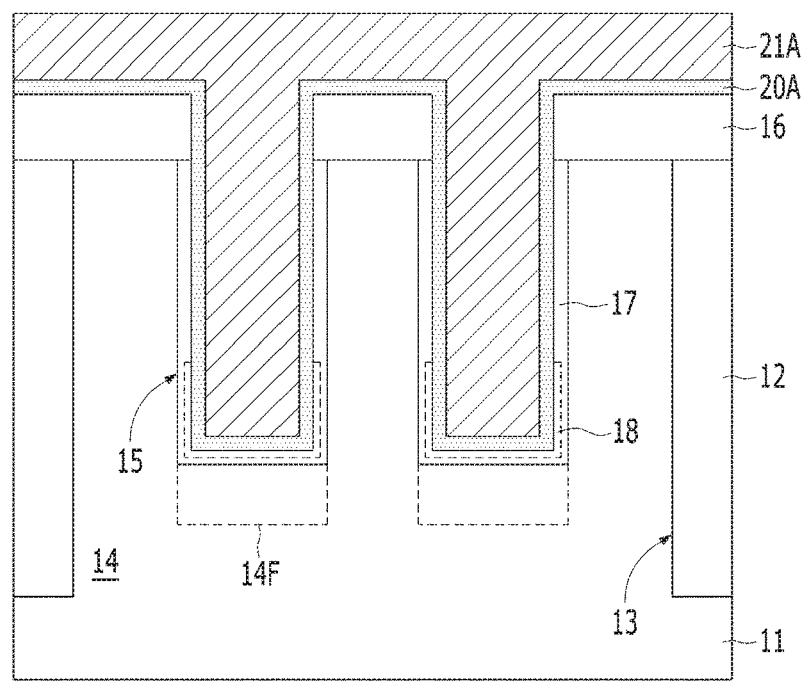
Figure 4G:
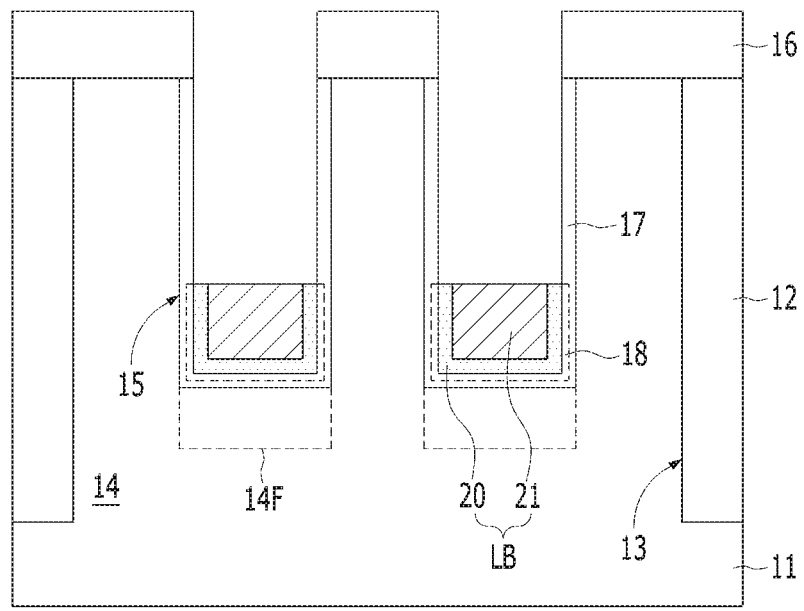
Figure 4H:
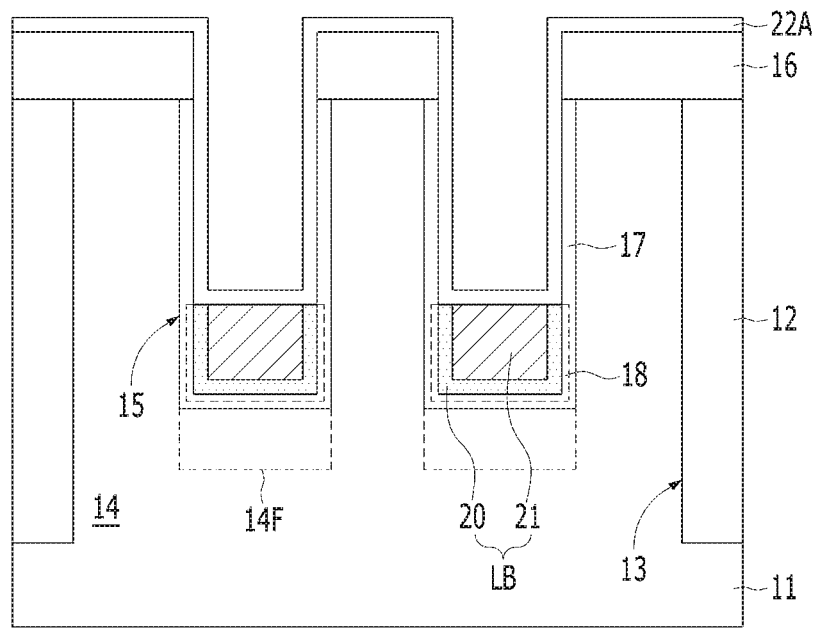
Figure 4I:
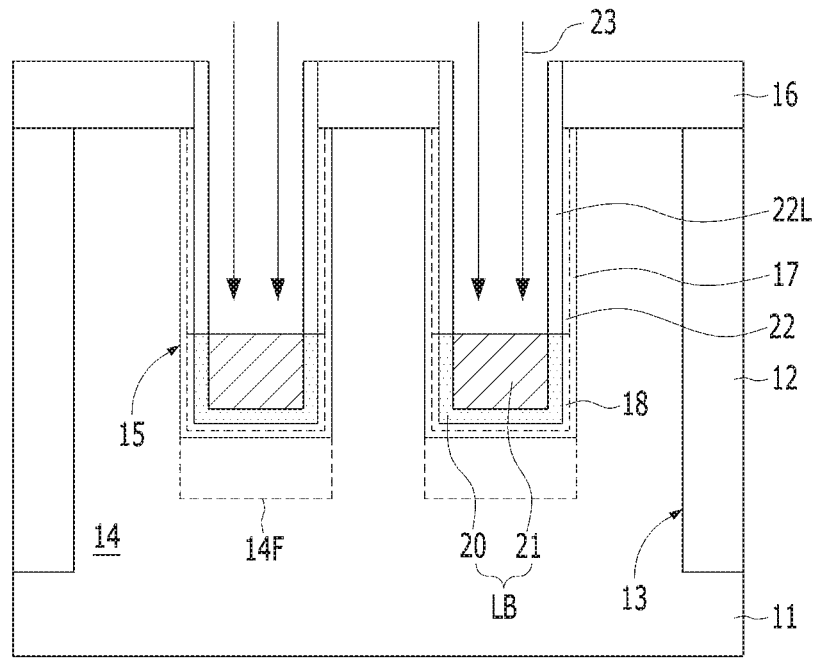
Figure 4J:
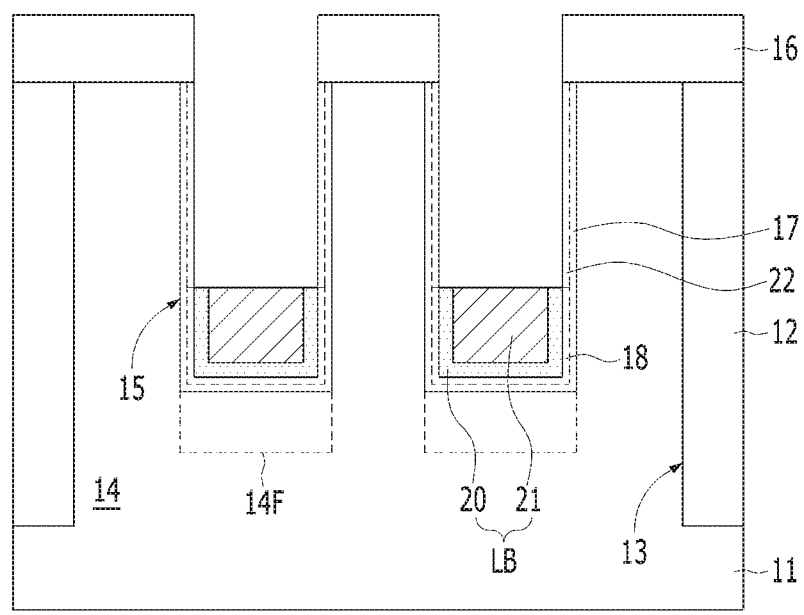
Figure 4K:
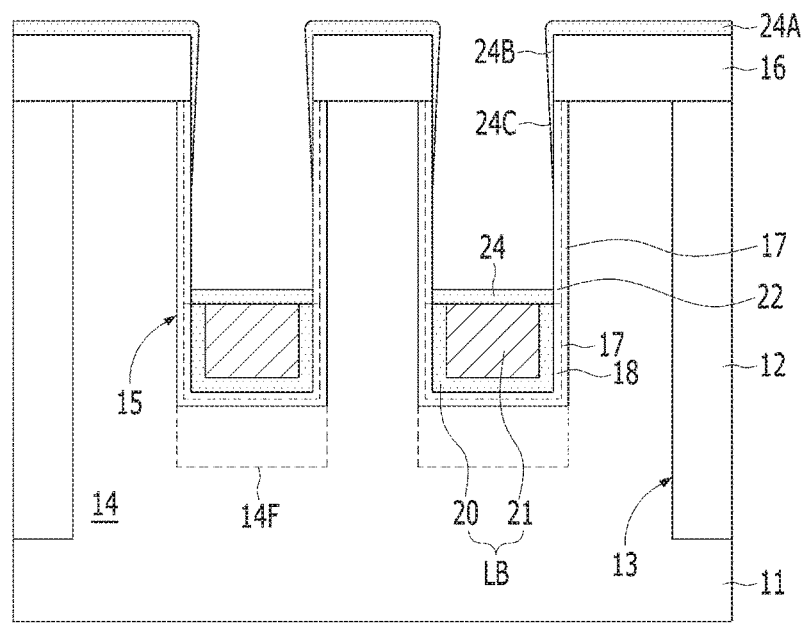
Figure 4L:
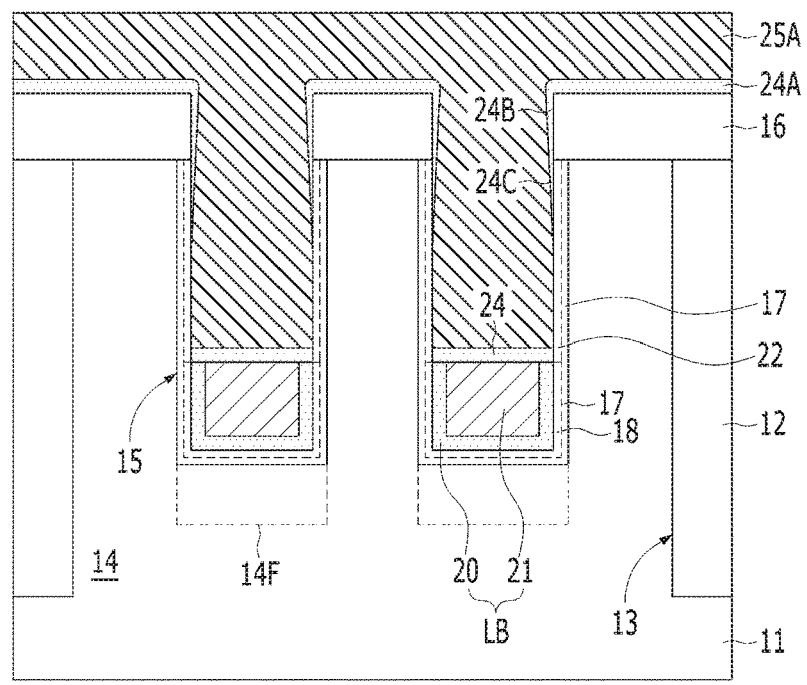
Figure 4M:
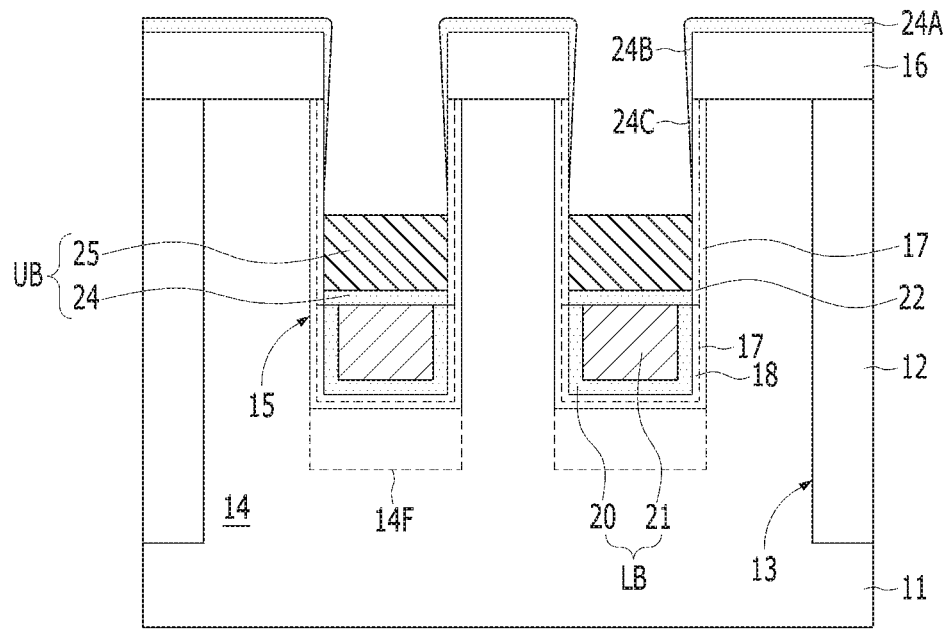
Figure 4N:
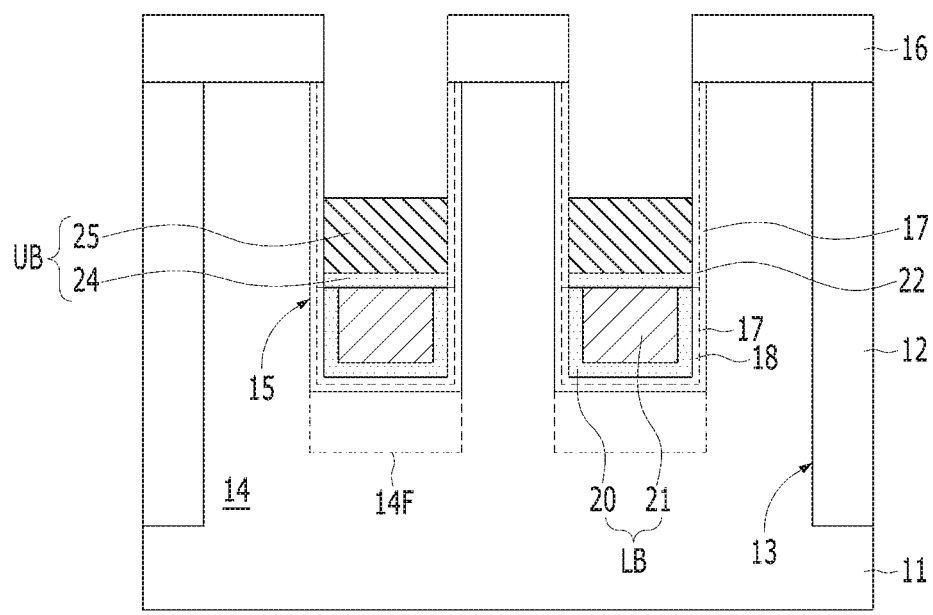
Figure 4O:
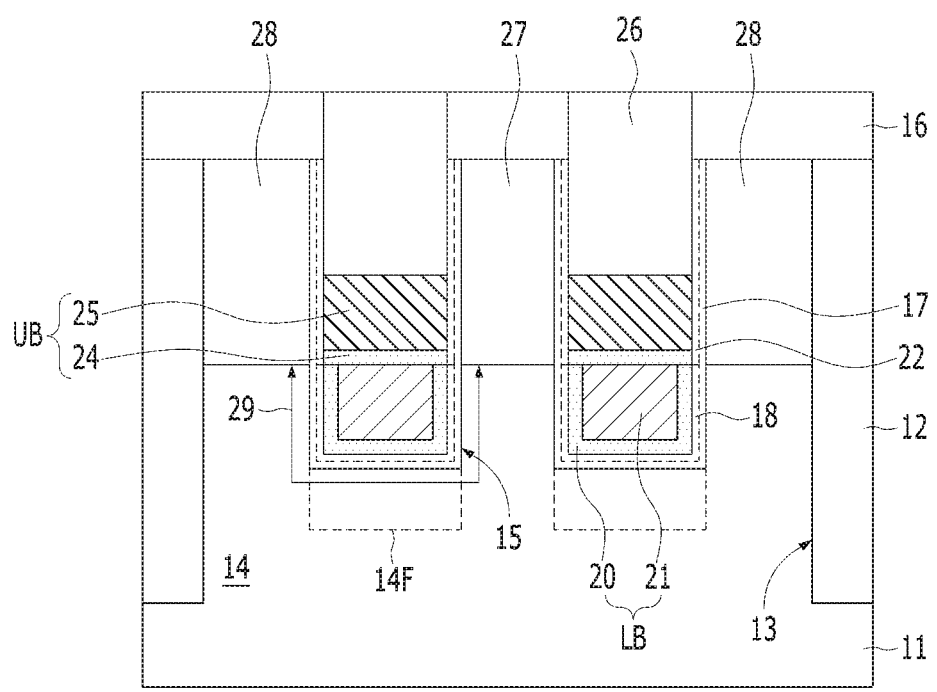

FIGS. 4A to 4O are cross-sectional views illustrating an example of a method for forming a semiconductor device in accordance with an embodiment. FIGS. 4A to 4O illustrate an example of a method for forming the semiconductor device 300 illustrated in FIG. 3B.

As illustrated in FIG. 4A, an isolation layer 12 may be formed in a substrate 11. An active region 14 may be defined by the isolation layer 12. The isolation layer 12 may be formed by a Shallow Trench Isolation (STI) process. For example, an isolation trench 13 may be formed by etching the substrate 11. The isolation trench 13 may be filled with a dielectric material to form the isolation layer 12. The isolation layer 12 may include silicon oxide, silicon nitride or a combination thereof. The isolation trench 13 may be filled with a dielectric material through a Chemical Vapor Deposition (CVD) process or another deposition process. Also, a planarization process such as Chemical-Mechanical Polishing (CMP) may be additionally performed.

A trench 15 may be formed in the substrate 11. The trench 15 may have a line shape crossing the active region 14 and the isolation layer 12. The trench 15 may be formed etching the substrate 11 using a hard mask layer 16 as an etch mask. The hard mask layer 16 may be formed on the substrate 11, and have a line-shaped opening for each trench 15 to be formed. The hard mask layer 16 may be formed of a material having an etch selectivity to the substrate 11. The hard mask layer 16 may be formed of silicon oxide, such as Tetra-Ethyl-Ortho-Silicate (TEOS). The trench 15 may be formed to be shallower than the isolation trench 13. The trench 15 may be sufficiently deep to make a large average cross-sectional area of a gate electrode, which is to be formed subsequently. In this way, the resistance of the gate electrode may be decreased. The bottom edge of the trench 15 may have a flat surface. In an embodiment, the bottom edge of the trench 15 may have a curvature (not shown).

Subsequently, a fin region 14F may be formed. The fin region 14F may be formed by selectively recessing the isolation layer 12 below the trench 15. For the structure of the fin region 14F, the reference may be made to the fin region 104F of FIG. 2B.

As illustrated in FIG. 4B, a gate dielectric layer 17 may be formed on the surface of the trench 15, Before the gate dielectric layer 17 may be formed, the surface of the trench 15 that is damaged from the etch process may be recovered. For example, a sacrificial oxide may be formed by a thermal oxidation treatment, and then the sacrificial oxide may be removed.

The gate dielectric layer 17 may be formed by a thermal oxidation process. The gate dielectric layer 17 may include silicon oxide.

In an embodiment, the gate dielectric layer 17 may be formed by a deposition process, such as a CVD process or an Atomic Layer Deposition (ALD) process. The gate dielectric layer 17, which may be formed by the deposition process, may include a high-k material, oxide, nitride, oxynitride or combinations thereof. The high-k material may include a hafnium-containing material. The hafnium-containing material may include hafnium oxide, hafnium silicon oxide, hafnium silicon oxynitride or combinations thereof. In an embodiment, the high-k material may include lanthanum oxide, lanthanum aluminum oxide, zirconium oxide, zirconium silicon oxide, zirconium silicon oxynitride, aluminum oxide or combinations thereof. As the high-k material, other high-k materials may also be selectively used. The gate dielectric layer 17 may include a material having a high areal density of oxygen atoms.

Sequentially, a first sacrificial material 18A may be formed. The first sacrificial material 18A may include a first chemical species. The first chemical species may generate a dipole that increases a valid work function. The first chemical species may include a metal atom. The first sacrificial material 18A may include titanium, hafnium, tantalum, aluminum, zirconium or combinations thereof. The first sacrificial material 18A may be conformally deposited on the gate dielectric layer 17. The first sacrificial material 18A may be formed by the ALD process.

The first sacrificial material 18A may include a material having a higher areal density of oxygen atoms than silicon oxide ($SiO_2$). The first sacrificial material 18A and the gate dielectric layer 17 may have different areal densities of oxygen atoms. The first sacrificial material 18A may have a higher areal density of oxygen atoms than the gate dielectric layer 17. A high areal density of oxygen atoms may refer to a large oxygen content per unit volume. The ratio of the areal density of oxygen atoms of the first sacrificial material 18A to silicon oxide ($SiO_2$) may be greater than 1.

The first sacrificial material 18A may be formed of a high oxygen containing-metal oxide having a larger oxygen content per unit volume than the gate dielectric layer 17. When the gate dielectric layer 17 is silicon oxide ($SiO_2$), the first sacrificial material 18A may include a material having a higher areal density of oxygen atoms than silicon oxide ($SiO_2$), that is, a material having a large oxygen content per unit volume. The first sacrificial material 18A may include titanium oxide ($TiO_2$), hafnium oxide ($HfO_2$), tantalum oxide ($Ta_2O_5$), aluminum oxide ($Al_2O_3$), zirconium oxide ($ZrO_2$) or combinations thereof.

In an embodiment, the first sacrificial material 18A may include a metal layer. In other words, the first sacrificial material 18A may include a titanium layer, a hafnium layer, a tantalum layer, an aluminum layer, a zirconium layer or combinations thereof.

As illustrated in FIG. 4C, a protective layer 18B may be formed on the first sacrificial material 18A. Subsequently, the protective layer 18B may be recessed. The protective layer 18B may have a shape of partially filling the trench 15. For example, the protective layer 18B may fill a lower region of the trench 15. The protective layer 18B may include a material having an etch selectivity to the first sacrificial material 18A. The protective layer 18B may include a photoresist, polysilicon and the like.

Subsequently, the first sacrificial material 18A may be recessed. In order to recess the first sacrificial material 18A, an etch-back process may be performed using the protective layer 18B as an etch barrier.

A first sacrificial liner 18L may be formed by the etch-back process on the first sacrificial material 18A. The first sacrificial liner 18L may partially cover the surface of the gate dielectric layer 17. The first sacrificial liner 18L may be located in the lower region of the trench 15. The top surfaces of the first sacrificial liner 18L and the protective layer 18B may be located at the same level.

As illustrated in FIG. 4D, a first thermal annealing process 19 may be performed. The first thermal annealing process 19 may be performed after the protective layer 18B is removed. The first thermal annealing process 19 may include a rapid thermal annealing (RTA) process.

The first sacrificial liner 18L may be exposed to the first thermal annealing process 19. When the first thermal annealing process 19 is performed, the first chemical species may be diffused from the first sacrificial liner 18L. The diffused first chemical species may be uniformly located on the surface of the gate dielectric layer 17. The diffused first chemical species may be located at the interface between the gate dielectric layer 17 and the first sacrificial liner 18L. Accordingly, a first dipole inducing portion 18 may be formed in the gate dielectric layer 17. The first dipole inducing portion 18 may include the diffused first chemical species. The first dipole inducing portion 18 may include titanium, hafnium, tantalum, aluminum, zirconium or combinations thereof. The gate dielectric layer 17 may be formed of silicon oxide, and the first dipole inducing portion 18 may be first chemical species-diffused silicon oxide. For example, the first dipole inducing portion 18 may be titanium-diffused silicon oxide (Ti-diffused $SiO_2$), hafnium-diffused silicon oxide (Hf-diffused $SiO_2$), tantalum-diffused silicon oxide (Ta-diffused $SiO_2$), aluminum-diffused silicon oxide (Al-diffused $SiO_2$) or zirconium-diffused silicon oxide (Zr-diffused $SiO_2$). The first chemical species-diffused silicon oxide may be referred to as "metal silicate".

The first dipole inducing portion 18 may be a material having a higher areal density of oxygen atoms than silicon oxide ($SiO_2$). The first dipole inducing portion 18 and the gate dielectric layer 17 may have different areal densities of oxygen atoms. The first dipole inducing portion 18 may have a higher areal density of oxygen atoms than the gate dielectric layer 17. The ratio of the areal density of oxygen atoms of the first dipole inducing portion 18 to silicon oxide ($SiO_2$) may be greater than 1.

The first dipole inducing portion 18 may be disposed in the gate dielectric layer 17 on the lower side of the trench 15.

As illustrated in FIG. 4E, the first sacrificial liner 18L may be removed. The first sacrificial liner 18L may be removed by a wet etch process. By applying the wet etch process to the first sacrificial liner 18L as described above, the first sacrificial liner 18L may be selectively removed without attacking the gate dielectric layer 17.

By removing the first sacrificial liner 18L, voids may be prevented from occurring while a first barrier material and a first gate electrode are formed subsequently.

As illustrated in FIG. 4F, a first barrier material 20A may be formed on the first dipole inducing portion 18 and the gate dielectric layer 17. The first barrier material 20A may be conformally formed on the surface of the gate dielectric layer 17. The first barrier material 20A may include a metal-based material. The first barrier material 20A may include metal nitride. The first barrier material 20A may include titanium nitride or tantalum nitride. The first barrier material 20A may be formed by the ALD or CVD process.

A first conductive layer 21A may be formed on the first barrier material 20A. The first conductive layer 21A may fill the trench 15 on the first barrier material 20A. The first conductive layer 21A may be formed of a low-resistance metal material including, for example, tungsten. The first conductive layer 21A may be formed by the CVD or ALD process.

Since the first barrier material 20A and the first conductive layer 21A are formed after the first sacrificial material 18A is removed, the trench 15 may be filled with the first conductive layer 21A without voids.

As illustrated in FIG. 4G, a first barrier layer 20 and a first gate electrode 21 may be formed in the trench 15. In order to form the first barrier layer 20 and the first gate electrode 21, a recessing process may be performed. The recessing process may include a dry etch process, for example, an etch-back process. The first barrier layer 20 may be formed by performing the etch-back process on the first barrier material 20A. The first gate electrode 21 may be formed by performing the etch-back process on the first conductive layer 21A. In an embodiment, a planarization process may be performed in advance to expose the top surface of the hard mask layer 16, and then the etch-back process of the recessing process may be performed. The top surfaces of the first barrier layer 20 and the first gate electrode 21 may be located at the same level.

The top surfaces of the first barrier layer 20 and the first gate electrode 21 may be recessed at a lower level than the top surface of the active region 14. The first barrier layer 20 and the first gate electrode 21 may be abbreviated as a "lower buried portion LB".

After the first barrier layer 20 and the first gate electrode 21 are formed, the surface of the gate dielectric layer 17 may be partially exposed.

The first dipole inducing portion 18 may serve to increase a valid work function of the lower buried portion LB.

A first dipole (refer to reference numeral 'D1' of FIGS. 3A to 3C) may be formed between the gate dielectric layer 17 and the first dipole inducing portion 18 which have different areal densities of oxygen atoms. Specifically, the oxygen of the first dipole inducing portion 18 moves to the gate dielectric layer 17, and thus a positive charge may be formed in the first dipole inducing portion 18, and a negative charge may be formed in the gate dielectric layer 17. By the positive and negative charges, the first dipole D1 may be formed in the direction from the gate dielectric layer 17 toward the first dipole inducing portion 18. The valid work function of the lower buried portion LB may be increased by the first dipole D1.

As illustrated in FIG. 4H, a second sacrificial material 22A may be formed. The second sacrificial material 22A may include a second chemical species. The second chemical species may generate a dipole that reduces a valid work function. The second chemical species may include a metal atom. The first and second chemical species may be different materials. The second sacrificial material 22A may include lanthanum, barium, lutetium, strontium or combinations thereof. The second sacrificial material 22A may be conformally deposited on the first gate electrode 21 and the gate dielectric layer 17. The second sacrificial material 22A may be formed by the ALD process.

The second sacrificial material 22A may include a material having a lower areal density of oxygen atoms than silicon oxide ($SiO_2$). The second sacrificial material 22A and the gate dielectric layer 17 may have different areal densities of oxygen atoms. The second sacrificial material 22A may have a lower areal density of oxygen atoms than the gate dielectric layer 17. A low areal density of oxygen atoms may refer to a small oxygen content per unit volume. The ratio of the areal density of oxygen atoms of the second sacrificial material 22A to silicon oxide ($SiO_2$) may be smaller than 1.

The second sacrificial material 22A may be formed of a low oxygen containing-metal oxide having a smaller oxygen content per unit volume than the gate dielectric layer 17. When the gate dielectric layer 17 is silicon oxide ($SiO_2$), the second sacrificial material 22A may include a material having a lower areal density of oxygen atoms than silicon oxide ($SiO_2$), that is, a material having a small oxygen content per unit volume. The second sacrificial material 22A may include lanthanum oxide ($La_2O_3$), barium oxide (BaO), lutetium oxide ($Lu_2O_3$), strontium oxide (SrO) or combinations thereof.

In an embodiment, the second sacrificial material 22A may include a metal layer. In other words, the second sacrificial material 22A may include a lanthanum layer, a barium layer, a lutetium layer, a strontium layer or combinations thereof.

As illustrated in FIG. 4I, a second sacrificial liner 22L may be formed. The second sacrificial liner 22L may be formed by performing an etch-back process on the second sacrificial material 22A. The second sacrificial liner 22L may cover the surface of the gate dielectric layer 17. The second sacrificial liner 22L may be located in the upper region of the trench 15. The second sacrificial liner 22L may have a spacer shape.

Subsequently, a second thermal annealing process 23 may be performed. The second thermal annealing process 23 may include a rapid thermal annealing (RTA) process. The second sacrificial liner 22L may be exposed to the second thermal annealing process 23. When the second thermal annealing process 23 is performed, the second chemical species may be diffused from the second sacrificial liner 22L. The diffused second chemical species may be uniformly located on the surface of the gate dielectric layer 17. The diffused second chemical species may be located at the interface between the gate dielectric layer 17 and the second sacrificial liner 22L. Accordingly, a second dipole inducing portion 22 may be formed in the gate dielectric layer 17. The second dipole inducing portion 22 may include the diffused second chemical species. The second dipole inducing portion 22 may include lanthanum, barium, lutetium, strontium or combinations thereof. The gate dielectric layer 17 may be formed of silicon oxide, and the second dipole inducing portion 22 may be second chemical species-diffused silicon oxide. For example, the second dipole inducing portion 22 may be lanthanum-diffused silicon oxide (La-diffused $SiO_2$), barium-diffused silicon oxide (Ba-diffused $SiO_2$), lutetium-diffused silicon oxide (Lu-diffused $SiO_2$) or strontium-diffused silicon oxide (Sr-diffused $SiO_2$). The second chemical species-diffused silicon oxide may be referred to as "metal silicate".

The second dipole inducing portion 22 may be a material having a lower areal density of oxygen atoms than silicon oxide ($SiO_2$). The second dipole inducing portion 22 and the gate dielectric layer 17 may have different areal densities of oxygen atoms. The second dipole inducing portion 22 may have a lower areal density of oxygen atoms than the gate dielectric layer 17. The ratio of the areal density of oxygen atoms of the second dipole inducing portion 22 to silicon oxide ($SiO_2$) may be smaller than 1.

The second dipole inducing portion 22 may be disposed in the gate dielectric layer 17 on the upper side of the trench 15.

In an embodiment, while the second sacrificial material 22A remains, the second thermal annealing process 23 may be performed.

As illustrated in FIG. 4J, the second sacrificial liner 22L may be removed. The second sacrificial liner 22L may be removed by a wet etch process. By applying the wet etch process to the second sacrificial liner 22L as described above, the second sacrificial liner 22L may be selectively removed without attacking the gate dielectric layer 17.

As illustrated in FIG. 4K, a second barrier material 24 may be formed on the top surface of the first gate electrode 21. The first barrier layer and the second barrier material 20 and 24 may be formed of the same material or different materials. The second barrier material 24 may include a metal-based material. The second barrier material 24 may include metal nitride. The second barrier material 24 may include titanium nitride, tantalum nitride, tungsten nitride or combinations thereof. The second barrier material 24 may be non-conformally formed. The non-conformal second barrier material 24 may be formed by PVD. For example, according to the PVD, the second barrier material 24 may cover the top surface of the first gate electrode 21, and not cover a part of the gate dielectric layer 17.

When the second barrier material 24 is deposited, first to third dummy materials 24A, 24B and 24C may be formed. The first to third dummy materials 24A, 24B and 24C may be made of the same material as the second barrier material 24. The first dummy material 24A may cover the top surface of the hard mask layer 16, the second dummy material 24B may be extended from the first dummy material 24A and cover the side walls of the hard mask layer 16, and the third dummy material 24C may be extended from the second dummy material 24B and cover a part of the top of the gate dielectric layer 17.

As described above, when the second barrier material 24 is deposited, the first to third dummy materials 24A, 24B and 24C may be formed.

The second barrier material 24 may include titanium nitride deposited by the PVD, that is, PVD TiN. The second barrier material 24 may serve to prevent inter-diffusion or interaction between the first gate electrode 21 and a subsequent second gate electrode. The first to third dummy materials 24A, 24B and 24C may be removed in a subsequent process.

As illustrated in FIG. 4L, a second conductive layer 25A may be formed on the second barrier material 24 and the gate dielectric layer 17. The second conductive layer 25A may fill the trench 15 on the gate dielectric layer 17. The second conductive layer 25A may be formed of a material having a low work function. For example, the second conductive layer 25A may include polysilicon having a low work function, for example, polysilicon doped with an N-type impurity. In an embodiment, the second conductive layer 25A may be formed by CVD or ALD. In an embodiment, the first gate electrode 21 and the second conductive layer 25A may be different materials. In an embodiment, the first gate electrode 21 and the second conductive layer 25A may be made of the same material. Forming the second conductive layer 25A of a low-resistance material may decrease gate sheet resistance.

As illustrated in FIG. 4M, a second gate electrode 25 may be formed in the trench 15. In order to form the second gate electrode 25, a recessing process may be performed. The recessing process may include a dry etch process, for example, an etch-back process. The second gate electrode 25 may be formed by performing the etch-back process on the second conductive layer 25A. In an embodiment, a planarization process may be performed in advance to expose the hard mask layer 16, and then the etch-back process of the recessing process may be performed. The top surface of the second gate electrode 25 may be recessed at a lower level than the top surface of the active region 14.

The first to third dummy materials 24A, 24B and 24C may serve to protect the gate dielectric layer 17 while the etch-back process is performed on the second conductive layer 25A. In other words, the gate dielectric layer 17 may be prevented from getting damaged while the etch-back process is performed on the second conductive layer 25A.

The third dummy material 24C may not remain on the contact surface between the second gate electrode 25 and the gate dielectric layer 17. To this end, the height of the second gate electrode 25 may be adjusted.

In addition, while the etch-back process is performed on the second conductive layer 25A, the gate dielectric layer 17 may be prevented from getting damaged. The second dipole inducing portion 22 may serve as a protective layer for preventing the etch damage to the gate dielectric layer 17. Since the gate dielectric layer 17 remains without damage, a GIDL may be improved.

The second barrier material 24 and the second gate electrode 25 may be referred to as an "upper buried portion UB". Accordingly, a dual buried gate structure including the lower buried portion LB and the upper buried portion UB may be formed. For example, the lower buried portion LB may include the first gate electrode 21 having low resistance, and in an embodiment, the upper buried portion UB may include the second gate electrode 25 having a low work function. The gate resistance of the dual buried gate structure may be lowered by the first gate electrode 21, and the GIDL may be improved by the second gate electrode 25. The second barrier material 24 may prevent inter-diffusion and interaction between the first gate electrode 21 and the second gate electrode 25. Since the second barrier material 24 is not present on the side wall of the second gate electrode 25, the GIDL may be further improved by the second gate electrode 25.

The second dipole inducing portion 22 may serve to decrease a valid work function of the upper buried portion UB. A second dipole (refer to 'D2' of FIGS. 3A to 3C) may be formed between the gate dielectric layer 17 and the second dipole inducing portion 22 which have different areal densities of oxygen atoms. Specifically, the oxygen of the gate dielectric layer 17 moves to the second dipole inducing portion 22, and thus a negative charge may be formed in the second dipole inducing portion 22, and a positive charge may be formed in the gate dielectric layer 17. By the positive and negative charges, the second dipole D2 may be formed in the direction from the second dipole inducing portion 22 toward the gate dielectric layer 17. The valid work function of the upper buried portion UB may be decreased by the second dipole D2.

As illustrated in FIG. 4N, the first to third dummy materials 24A, 24B and 24C may be removed. The first to third dummy materials 24A, 24B and 24C may be removed by a wet etch process. At this time, the hard mask layer 16, the gate dielectric layer 17 and the second gate electrode 25 may not be lost. As the first to third dummy materials 24A, 24B and 24C are removed, the surface of the gate dielectric layer 17 may be exposed.

In an embodiment, the first to third dummy materials 24A, 24B and 24C may not remain when the process of forming the second gate electrode 25 is completed. In other words, all of the first to third dummy materials 24A, 24B and 24C may be removed at the time when the etch-back process performed on the second conductive layer 25A is completed.

As illustrated in FIG. 4O, a capping layer 26 may be formed on the second gate electrode 25 and the gate dielectric layer 17. The capping layer 26 may be formed of a dielectric material including a silicon nitride. Subsequently, the capping layer 26 may be planarized so that the top surface of the hard mask layer 16 is exposed. The capping layer 26 may have an Oxide-Nitride-Oxide (ONO) structure.

Through a series of processes described above, a buried gate structure may be formed. The buried gate structure may include the gate dielectric layer 17, the first dipole inducing portion 18, the first barrier layer 20, the first gate electrode 21, the second dipole inducing portion 22, the second barrier material 24, the second gate electrode 25 and the capping layer 26. The top surface of the second gate electrode 25 may be located at a lower level than the top surface of the active region 14. As the top surface of the second gate electrode 25 is recessed at a low level, a physical distance between the second gate electrode 25 and the peripheral conductive material, e.g., a contact plug, may be sufficiently secured.

After the capping layer 26 is formed, a doping process of an impurity may be performed by implantation or other doping techniques. Accordingly, a first doped region 27 and a second doped region 28 are formed in the substrate 11. The first and second doped regions 27 and 28 may have a depth that horizontally overlaps with the second gate electrode 25 and the gate dielectric layer 17. The second dipole inducing portion 22 may horizontally overlap the first and second doped regions 27 and 28. The first barrier layer 20 and the first gate electrode 21 may not horizontally overlap the first and second doped regions 27 and 28. The lowest portion of the second dipole inducing portion 22 may be located at the same level as the lowest portions of the first and second doped regions 27 and 28.

As the first and second doped regions 27 and 28 are formed, a channel 29 may be defined along the surface of the trench 15. The length of the channel 29 may be defined by the lower buried portion LB.

The first dipole inducing portion 18 and the gate dielectric layer 17 may be located between the lower buried portion LB and the channel 29, and the second dipole inducing portion 22 and the gate dielectric layer 17 may be located between the upper buried portion UB and the first and second doped regions 27 and 28.

FIGS. 5A to 5D are cross-sectional views illustrating another example of a method for forming a semiconductor device. The method illustrated in FIGS. 5A to 5D may be similar to the method illustrated in FIGS. 4A to 4O.

Through the method illustrated in FIG. 4A to 4J, a second dipole inducing portion 22 may be formed.

Figure 5A:
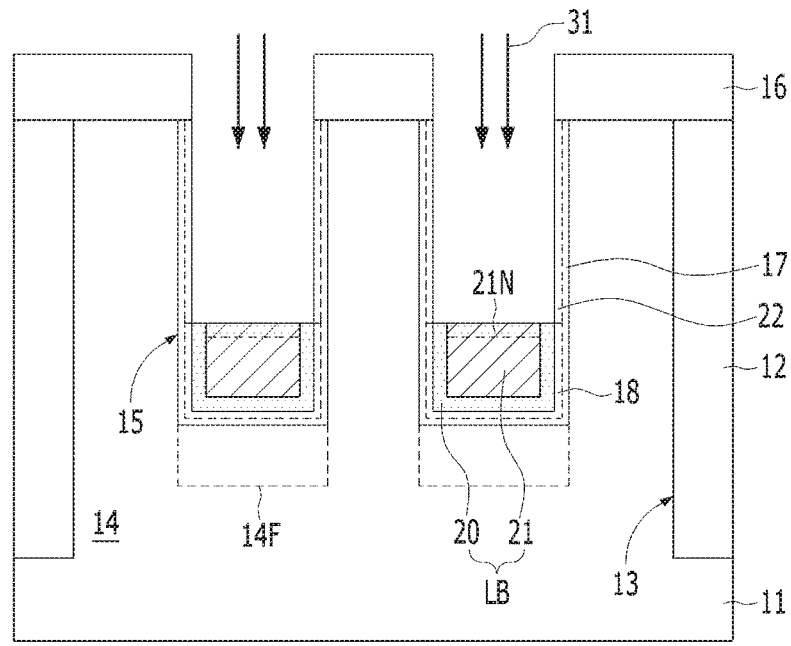
FIGS. 5A to 5D are cross-sectional views illustrating another example of a method for forming a semiconductor device.

Subsequently, as illustrated in FIG. 5A, a plasma treatment 31 may be performed. The plasma treatment 31 may be performed in the atmosphere of a nitrogen-containing gas or an oxygen-containing gas. The plasma treatment 31 may include plasma nitridation or plasma oxidation.

The top surface of a lower buried portion LB may be modified by the plasma treatment 31. For example, the top surface of the lower buried portion LB may be nitrided by plasma nitridation. A second barrier layer 21N may be formed by such plasma nitridation. The second barrier layer 21N may be a portion in which the top surface of a first gate electrode 21 is nitrided. The second barrier layer 21N may be a nitride of the first gate electrode 21. When the first gate electrode 21 includes tungsten, the second barrier layer 21N may be tungsten nitride.

As described above, the second barrier layer 21N may be selectively formed only on the top surface of the lower buried portion LB.

Figure 5B:
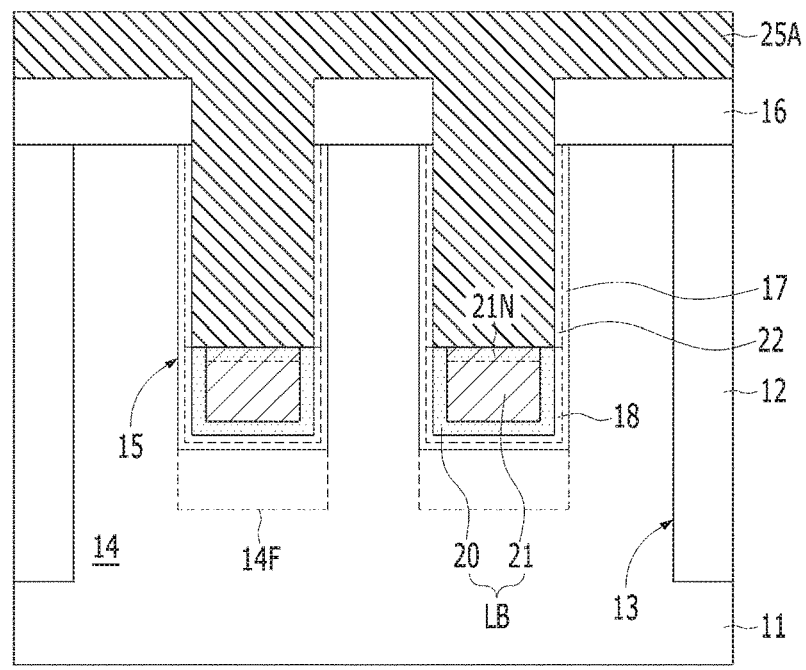

As illustrated in FIG. 5B, a second conductive layer 25A may be formed on the second barrier layer 21N. The second conductive layer 25A may fill a trench 15 on the second barrier layer 21N. The second conductive layer 25A may be formed of a material having a low work function. For example, the second conductive layer 25A may include polysilicon having a low work function, such as polysilicon doped with an N-type impurity. In an embodiment, the second conductive layer 25A may be formed by CVD or ALD. The first gate electrode 21 and the second conductive layer 25A may be different materials. In an embodiment, the first gate electrode 21 and the second conductive layer 25A may be made of the same material. Forming the second conductive layer 25A of a low-resistance material may decrease gate sheet resistance.

Figure 5C:
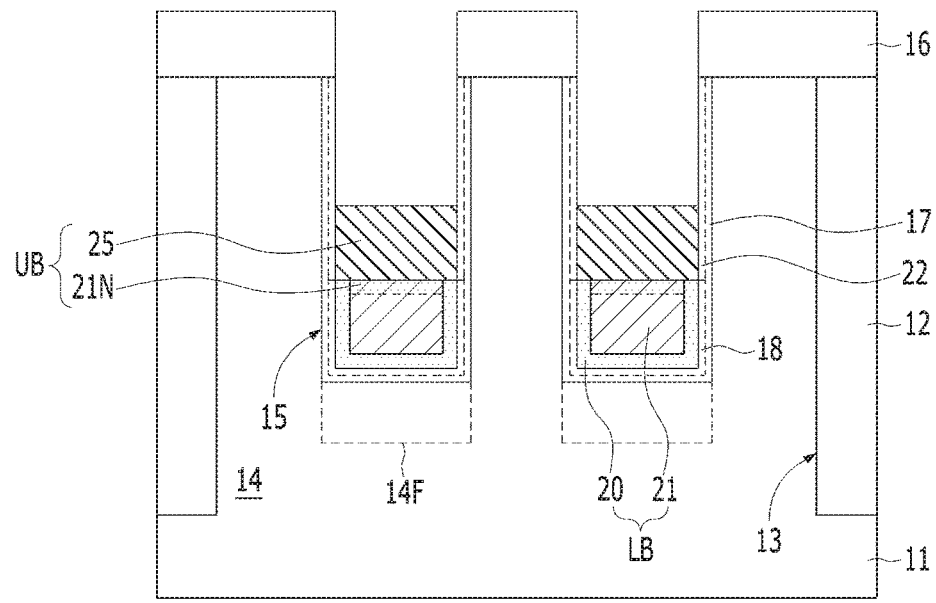

As illustrated in FIG. 5C, a second gate electrode 25 may be formed in the trench 15. In order to form the second gate electrode 25, a recessing process may be performed. The recessing process may include a dry etch process, for example, an etch-back process. The second gate electrode 25 may be formed by performing the etch-back process on the second conductive layer 25A. In an embodiment, a planarization process may be performed in advance to expose a hard mask layer 16, and then the etch-back process of the recessing process may be performed. The top surface of the second gate electrode 25 may be recessed at a lower level than the top surface of an active region 14.

The second barrier layer 21N and the second gate electrode 25 may be referred to as an "upper buried portion UB". Accordingly, a dual buried gate structure including the lower buried portion LB and the upper buried portion UB may be formed. For example, the lower buried portion LB may include the first gate electrode 21 having low resistance, and the upper buried portion UB may include the second gate electrode 25 having a low work function. The gate resistance of the dual buried gate structure may be lowered by the first gate electrode 21, and the GIDL may be improved by the second gate electrode 25. The second barrier layer 21N may prevent inter-diffusion and interaction between the first gate electrode 21 and the second gate electrode 25. Since the second barrier layer 21N is not present on the side wall of the second gate electrode 25, the GIDL may be further improved by the second gate electrode 25.

Figure 5D:
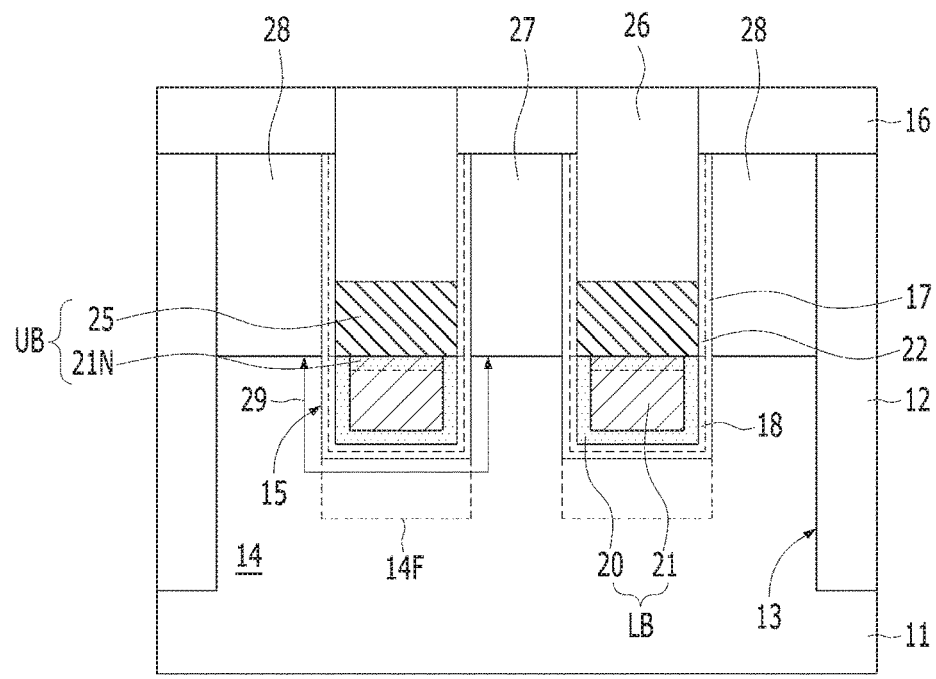

As illustrated in FIG. 5D, a capping layer 26 may be formed on the second gate electrode 25. The capping layer 26 may be formed of a dielectric material including a silicon nitride. Subsequently, the capping layer 26 may be planarized so that the top surface of the hard mask layer 16 is exposed. In an embodiment, the capping layer 26 may have an ONO structure.

After the capping layer 26 is formed, a doping process of an impurity may be performed by implantation or other doping techniques. Accordingly, a first doped region 27 and a second doped region 28 may be formed in a substrate 11.

Figure 6:
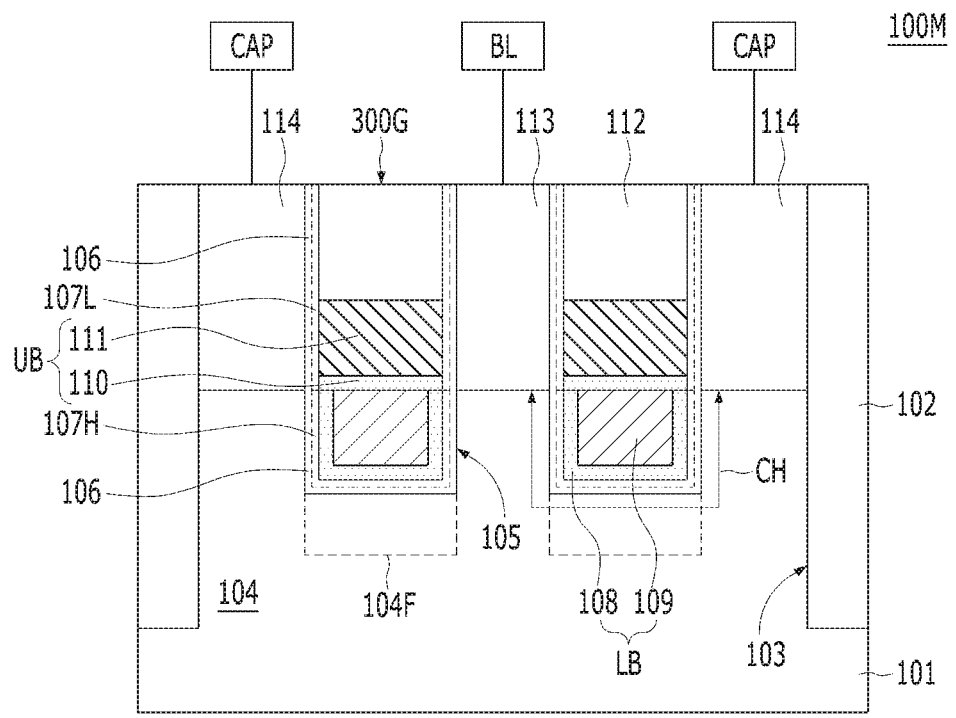
FIG. 6 is a cross-sectional view illustrating a memory cell.

FIG. 6 is a cross-sectional view illustrating a memory cell 100M.

Referring to FIG. 6, the memory cell 100M is illustrated. The memory cell 100M may include a cell transistor, a bit line BL and a capacitor CAP. The cell transistor may include the semiconductor device 300 of FIG. 3B. Accordingly, the cell transistor may include a buried gate structure 300G, a channel CH, a first doped region 113 and a second doped region 114. The first doped region 113 may be electrically connected to the bit line BL. The second doped region 114 may be electrically connected to the capacitor CAP.

In the memory cell 100M, the buried gate structure 300G may be referred to as a buried word line structure BWL. The buried word line structure BWL may be embedded in a trench 105. The buried word line structure BWL may include a gate dielectric layer 106, a first dipole inducing portion 107H, a second dipole inducing portion 107L, a first barrier layer 108, a first gate electrode 109, a second barrier layer 110, a second gate electrode 111 and a capping layer 112. The first and second dipole inducing portions 107H and 107L may be locally embedded in the gate dielectric layer 106.

The buried word line structure BWL may be replaced with any one of the buried gate structures in accordance with the above-described embodiments, other than the buried gate structure 300G.

The capacitor CAP may include a storage node, a dielectric layer and a plate node. The storage node may have a cylindrical shape or a pillar shape. The dielectric layer may be formed on the surface of the storage node. The dielectric layer may include at least one selected from a group including zirconium oxide, aluminum oxide and hafnium oxide. For example, the dielectric layer may have a ZAZ ($ZrO_2$/$Al_2O_3$/$ZrO_2$) structure where first zirconium oxide, aluminum oxide and second zirconium oxide are stacked. The plate node may be formed on the dielectric layer. The storage node and the plate node may include a metal-containing material.

The memory cell 100M may be a part of a Dynamic Random-Access Memory (DRAM) device. When the memory cell 100M is applied to the DRAM device, the refresh characteristics of the DRAM device may be improved. Also, it is possible to prevent off-leakage, which leads to improved retention time. Also, the resistance of the buried word line may be reduced.

According to an embodiment of the present invention, a dipole inducing a high work function may be formed between a channel and a buried gate, thereby reducing a channel dose and a junction leakage.

Also, according to an embodiment of the present invention, a dipole inducing a low work function may be formed between a buried gate and doped regions, thereby decreasing a GIDL.

Further, according to an embodiment of the present invention, dipole inducing portions are disposed in a gate dielectric layer, thereby improving the gap-fill characteristics of a buried gate.

While the present invention has been described with respect to specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A method for fabricating a semiconductor device comprising:
   forming a trench in a substrate;
   forming a gate dielectric layer over the trench;
   forming a first sacrificial material containing a first dipole inducing chemical species on the gate dielectric layer;
   selectively removing the first sacrificial material to form a first sacrificial liner on the gate dielectric layer on a lower side of the trench;
   diffusing the first dipole inducing chemical species into the gate dielectric layer on the lower side of the trench through a first thermal annealing process;
   removing the first sacrificial liner;
   forming a lower gate over the gate dielectric layer in contact with the first dipole inducing chemical species;
   forming a second dipole inducing chemical species in the gate dielectric layer on an upper side of the trench; and
   forming an upper gate over the lower gate, the upper gate being in contact with the second dipole inducing chemical species.

2. The method of claim 1, wherein the first dipole inducing chemical species comprises a first chemical species that increases a work function of the lower gate.

3. The method of claim 2, wherein the first chemical species comprises titanium, hafnium, tantalum, aluminum, zirconium or combinations thereof.

4. The method of claim 1, wherein the gate dielectric layer comprises silicon oxide, and the first dipole inducing chemical species comprises a material having a higher areal density of oxygen atoms than the silicon oxide.

5. The method of claim 1, wherein the first dipole inducing chemical species comprises titanium-diffused silicon oxide (Ti-diffused $SiO_2$), hafnium-diffused silicon oxide (Hf-diffused $SiO_2$), tantalum-diffused silicon oxide (Ta-diffused $SiO_2$), aluminum-diffused silicon oxide (Al-diffused $SiO_2$) or zirconium-diffused silicon oxide (Zr-diffused $SiO_2$).

6. The method of claim 1, wherein the second dipole inducing chemical species comprises a second chemical species that decreases a work function of the upper gate.

7. The method of claim 6, wherein the second chemical species comprises lanthanum, barium, lutetium, strontium or combinations thereof.

8. The method of claim 1, wherein the gate dielectric layer comprises silicon oxide, and the second dipole inducing chemical species comprises a material having a lower areal density of oxygen atoms than the silicon oxide.

9. The method of claim 1, wherein the second dipole inducing chemical species comprises lanthanum-diffused silicon oxide (La-diffused $SiO_2$), barium-diffused silicon oxide (Ba-diffused $SiO_2$), lutetium-diffused silicon oxide (Lu-diffused $SiO_2$) or strontium-diffused silicon oxide (Sr-diffused $SiO_2$).

10. The method of claim 1, wherein the forming of the second dipole inducing chemical species in the gate dielectric layer on the upper side of the trench comprises:
    forming a second sacrificial material containing the second dipole inducing chemical species on the lower buried portion and the gate dielectric layer;
    selectively removing the second sacrificial material to allow a second sacrificial liner to remain on the gate dielectric layer on the upper side of the trench;
    diffusing the second dipole inducing chemical species of the second sacrificial liner into the gate dielectric layer on the upper side of the trench through a second thermal annealing process; and
    removing the second sacrificial liner.

11. The method of claim 1, wherein the lower gate comprises a stack of a first barrier layer and a first gate electrode, and the upper gate comprises a stack of a second barrier layer and a second gate electrode.

12. The method of claim 11, wherein the first and second barrier layers comprise metal nitride, and the first and second gate electrodes comprise a metal.

13. The method of claim 11, wherein the first and second barrier layers comprise metal nitride, the first gate electrode comprises a low-resistance metal, and the second gate electrode comprises a material having a low work function.

14. The method of claim 13, wherein the material having the low work function comprises polysilicon doped with an N-type impurity.

15. The method of claim 1, wherein the lower and upper gates are formed of metal nitride.

16. The method of claim 1, wherein the lower and upper gates comprise a metal-based material, and further comprising forming polysilicon doped with an N-type impurity between the upper gate and the second dipole inducing chemical species.

17. The method of claim 1, further comprising forming a fin region below the trench before the forming of the gate dielectric layer, wherein the gate dielectric layer, the first dipole inducing chemical species and the lower gate cover a top surface and side walls of the fin region.

18. The method of claim 1, further comprising:
after the forming of the upper gate,
forming a capping layer on the upper gate; and
forming a first doped region and a second doped region having a depth that horizontally overlaps the capping layer and the upper gate in the substrate.

* * * * *